US012543425B2

(12) United States Patent
Sam et al.

(10) Patent No.: US 12,543,425 B2
(45) Date of Patent: Feb. 3, 2026

(54) SYSTEM TO RETROFIT END-OF-LIFE AND NEAR END-OF-LIFE SILICON SOLAR PANELS

(71) Applicant: Solaires Entreprises Inc., Victoria (CA)

(72) Inventors: Mahshid Sam, Victoria (CA); Alfonso Fabian De La Fuente Sanchez, Victoria (CA)

(73) Assignee: Solaires Entreprises Inc., Victoria (CA)

(*) Notice: Subject to any disclaimer, the term of this patent is extended or adjusted under 35 U.S.C. 154(b) by 133 days.

(21) Appl. No.: 18/183,888

(22) Filed: Mar. 14, 2023

(65) Prior Publication Data

US 2024/0315063 A1 Sep. 19, 2024

(51) Int. Cl.
*H10K 39/15* (2023.01)
*H02S 20/20* (2014.01)
*H02S 40/32* (2014.01)
*H10K 71/50* (2023.01)

(52) U.S. Cl.
CPC .......... *H10K 39/15* (2023.02); *H02S 20/20* (2014.12); *H02S 40/32* (2014.12); *H10K 71/50* (2023.02)

(58) Field of Classification Search
None
See application file for complete search history.

(56) References Cited

U.S. PATENT DOCUMENTS

| | | | |
|---|---|---|---|
| 7,968,790 B2 | 6/2011 | Raymond | |
| 11,251,621 B1* | 2/2022 | Hume | H02S 40/36 |
| 2009/0065046 A1* | 3/2009 | DeNault | H02S 40/44 |
| | | | 136/248 |
| 2010/0108122 A1* | 5/2010 | Everson | H02S 40/34 |
| | | | 136/246 |
| 2012/0006397 A1* | 1/2012 | Gou | H10F 71/103 |
| | | | 257/E31.032 |
| 2012/0080065 A1* | 4/2012 | Krajewski | H10F 19/80 |
| | | | 257/E21.705 |
| 2012/0204939 A1* | 8/2012 | Lee | H01L 31/0749 |
| | | | 257/E31.127 |
| 2014/0109952 A1* | 4/2014 | Jang | H10F 77/484 |
| | | | 136/246 |
| 2022/0059294 A1* | 2/2022 | Wang | H01L 31/0304 |
| 2022/0271705 A1* | 8/2022 | Higashi | H02S 40/425 |
| 2023/0042945 A1* | 2/2023 | Fleischer | H10K 71/70 |
| 2024/0322745 A1* | 9/2024 | Cha | H10F 19/904 |
| 2024/0415009 A1* | 12/2024 | Kamaraki | C03C 17/42 |

* cited by examiner

*Primary Examiner* — Jayne L Mershon
(74) *Attorney, Agent, or Firm* — Baumgartner Patent Law, LLC; Marc Baumgartner

(57) ABSTRACT

A photovoltaic film system is provided for use with a near end-of-life or end-of-life silicon solar panel, the photovoltaic film system comprising a translucent photovoltaic film stack which includes, in order, an outer protective layer, an outer translucent electrode layer, one of an electron transport layer or a hole transport layer, a semi-conductor perovskite layer, the other of the hole transport layer or the electron transport layer and an inner translucent electrode layer; an inverter; and electrical connectors connecting the inverter to each of the outer translucent electrode layer and the inner translucent electrode layer. The photovoltaic film system can be used to restore near end-of-life or end-of-life silicon solar panels in situ.

4 Claims, 22 Drawing Sheets

SYSTEM TO RETROFIT END-OF-LIFE AND NEAR END-OF-LIFE SILICON SOLAR PANELS

FIELD

The present technology is directed to a photovoltaic film system that includes thin film stacks or is a glass photovoltaic system. Either includes a semiconductor layer that is comprised of perovskites. More specifically, it is a system that allows near end-of-life and end-of-life silicon solar panels and the system to concomitantly collect solar energy, to remain in place and return to an acceptable light conversion efficiency.

BACKGROUND

Silicon solar panels have a lifetime of about 25 years. During this time, the conversion efficiency of the solar panels decreases. The average degradation of the silicon solar panel is 0.5% per year. Therefore, after 25 years of "useful lifespan" it will generate about 12-15% less energy than when new. Further, the band gap for silicon solar panels is 1.1 to 1.6 electron Volts (eV) and therefore these panels collect low energy photons.

The main causes that are responsible for production of less energy by the end of life of a silicon solar panel are temperature variation, ultraviolet light (UV light) exposure and mechanical damage. These temperature cycles and UV light exposure result in microcracks which represent solar cell degradation. The solar cells are made up of very thin silicon wafers which expand and contract as a result of thermal cycling. It means that during daytime when temperature is higher it will expand and during dark hours it will contract which causes imperfections in the silicon solar cells and leads to microcracks in the structure. Microcracks further create electrical separation resulting in inactive cells or isolation of parts of cells.

Other external factors that cause the failure of silicon solar panels are clamping, transport and installation, quick connector failure and lightning. Internal factors that are most commonly found for failure of silicon solar panels are delamination, junction box failure, back sheet adhesion loss and frame breakage.

Removing end-of-life silicon solar panels from rooftops is problematic as specialized equipment is needed to remove both the silicon solar panels and their fixtures. Additionally, the roof needs to be repaired because of the screws or fixtures that were affixing the solar panels to the roof.

US Patent Application Publication No. 20090065046 discloses a system for a retrofitting a photovoltaic energy collector, by coupling a thermal energy absorbing working fluid casing for flowing heat out to a heat sink. The solar module is cooled by the working fluid transferring unproductive heat away from the photovoltaic array and into an exterior heat sink via the cooling fluid circuit, thus making the photovoltaic array more efficient, while adding another energy source. The retrofitting can be done at the consumers convenience, discretion and site, overcoming the current requirement forcing the consumer to decide on one solar technology over another with competing needs. This is a complex approach to solving the issues associated with near end-of-life and end-of-life solar panels.

U.S. Pat. No. 7,968,790 discloses a solar energy conversion assembly for efficiently capturing solar energy by providing additional chances to absorb reflected sunlight and providing longer path lengths in the photovoltaic (PV) material. The assembly includes a PV device including a layer of PV material and a protective top covering the PV material (e.g., a planar glass cover applied with adhesive to the PV material). The assembly further includes a PV enhancement film formed of a substantially transparent material, and film is applied to at least a portion of the protective top such as with a substantially transparent adhesive. The PV enhancement film includes a plurality of absorption enhancement structures on the substrate opposite the PV device. Each absorption enhancement structure includes a light receiving surface that refracts incident light striking the PV enhancement film to provide an average path length ratio of greater than about 1.20 in the layer of PV material. This does not provide a new photovoltaic film to work in conjunction with the near end-of-life or end-of-life solar panels.

What is needed is a system that can prolong the useful life of the silicon solar panel. It would be preferable if it could be used to retrofit the existing panel and associated fixtures. It would be further preferable if the system included a photovoltaic film stack that could be affixed to the existing panel. It would be further preferable if the system used perovskites in the film. It would be further preferable if the system included an inverter to collect energy from both the end-of-life or near end-of-life silicon solar panel and the replacement perovskite solar film.

What is also needed is a system that can improve the light conversion efficiency of silicon solar modules. It would be preferable if it could be used to retrofit the existing module and associated fixtures. It would be further preferable if the system included a photovoltaic glass stack that could be affixed to the existing module. It would be further preferable if the system used perovskites as the semiconductor. It would be further preferable if the system included a glass junction box layer to collect energy from both the end-of-life or near end-of-life silicon solar module and the glass perovskite photovoltaic system.

SUMMARY

A system comprising a photovoltaic film stack that is installed on top of an end-of-life or near end-of-life silicon solar panel is provided. The system can be installed in situ, hence there is no need to remove the solar panels from the roof or any other installation. The present technology further comprises an inverter that receives the energy collected from the previously installed solar panels and the newly installed photovoltaic films, wherein the inverter balances the energy received from both systems and injects it into a power distribution system (for example the grid) or to a power storage system (for example a battery). The photovoltaic film system restores the light conversion efficiency of the end-of-life or near end-of-life silicon solar panel by at least 4%.

Also provided is a glass perovskite photovoltaic system comprising a translucent photovoltaic stack that is installed on top of a silicon solar module. The system can be installed in situ, hence there is no need to remove the solar modules from the roof or any other installation. The present technology further comprises a glass junction box layer that receives the energy collected from the previously installed solar modules and the newly installed glass perovskite photovoltaic system, wherein the inverter balances the energy received from both systems and injects it into a power distribution system (for example the grid) or to a power storage system (for example a battery). The glass perovskite photovoltaic system improves the light conversion efficiency of the silicon solar module by at least 4%.

In one embodiment, a photovoltaic film system is provided for use with a near end-of-life or end-of-life silicon solar panel, the photovoltaic film system comprising a translucent photovoltaic film stack which includes, in order, an outer protective layer, an outer translucent electrode layer, one of an electron transport layer or a hole transport layer, a semi-conductor perovskite layer, the other of the hole transport layer or the electron transport layer and an inner translucent electrode layer; an inverter; and electrical connectors connecting the inverter to each of the outer translucent electrode layer and the inner translucent electrode layer.

In the photovoltaic film system, the semiconductor perovskite layer may be tuned to convert energy in a band gap of 1.2 electron Volts (eV) to 2.3 eV.

The photovoltaic film system may further comprise an adherent layer on the inner translucent electrode layer for affixing the translucent photovoltaic film stack to the near end-of-life or end-of-life silicon solar panel.

In another embodiment, a solar collector is provided, the solar collector comprising:
  a near end-of-life or end-of-life silicon solar panel, which includes an upper surface;
  a photovoltaic film system, the photovoltaic film system comprising a translucent photovoltaic film stack which includes, in order, an outer protective layer, an outer translucent electrode layer, one of an electron transport layer or a hole transport layer, a semi-conductor perovskite layer, the other of the hole transport layer or the electron transport layer, an inner translucent electrode layer; an inverter; and electrical connectors connecting the inverter to each of the outer translucent electrode layer and the inner translucent electrode layer; and
  an adherent layer, wherein the translucent photovoltaic film stack is adhered to the upper surface of the near end-of-life or end-of-life silicon solar panel with the adherent layer and the near end-of-life or end-of-life silicon solar panel is in electrical communication with the inverter.

In the solar collector, the semiconductor perovskite layer may be tuned to convert energy in a band gap of 1.2 eV to 2.3 eV.

The solar collector may further comprise a frame which retains the near end-of-life or end-of-life silicon solar panel and the photovoltaic film system.

The solar collector may be configured for concomitant light conversion in the translucent photovoltaic film stack and the near end-of-life or end-of-life solar panel.

In another embodiment, a method of restoring a near end-of-life or end-of-life silicon solar panel in situ is provided, the method comprising:
  manufacturing a photovoltaic film system, the photovoltaic film system comprising a translucent photovoltaic film stack which includes, in order, an outer protective layer, an outer translucent electrode layer, one of an electron transport layer or a hole transport layer, a semi-conductor perovskite layer, the other of the hole transport layer or the electron transport layer, an inner translucent electrode layer; an inverter; and electrical connectors connecting the inverter to each of the outer translucent electrode layer and the inner translucent electrode layer;
  adhering the translucent photovoltaic film stack to an upper surface of the near end-of-life or end-of-life silicon solar panel in situ; and
  electrically connecting the inverter to the near end-of-life or end-of-life silicon solar panel.

The method may further comprise tuning the semiconductor perovskite layer convert energy in a band gap of 1.2 eV to 2.3 eV prior to manufacturing the photovoltaic film system.

The method may further comprise framing the photovoltaic film system and the near end-of-life or end-of-life solar panel with a frame.

In another embodiment, a glass perovskite photovoltaic system is provided for use with a near end-of-life or end-of-life silicon solar module, the glass perovskite photovoltaic system comprising a translucent photovoltaic stack which includes, in order, a glass junction box layer, which includes a junction box, an outer translucent electrode layer, one of an electron transport layer or a hole transport layer, a semi-conductor perovskite layer, the other of the hole transport layer or the electron transport layer and an inner translucent electrode layer; and electrical connectors connecting the junction box to each of the outer electrode layer and the inner electrode layer.

In the glass perovskite photovoltaic system, the translucent photovoltaic stack may be curved to provide a convex upper surface.

In the glass perovskite photovoltaic system, the semiconductor perovskite layer may be tuned to convert energy in a band gap of 1.2 electron Volts (eV) to 2.3 eV.

The glass perovskite photovoltaic system may further comprise an adherent layer on the inner translucent electrode layer for affixing the translucent photovoltaic stack to the near end-of-life or end-of-life silicon solar module.

In another embodiment, an enhanced silicon solar collector is provided, the enhanced silicon solar collector comprising:
  a near end-of-life or end-of-life silicon solar module, which includes an upper surface;
  a glass perovskite photovoltaic system, the glass perovskite photovoltaic system comprising a translucent photovoltaic stack which includes, in order, a glass junction box layer which includes a junction box, an outer translucent electrode layer, one of an electron transport layer or a hole transport layer, a semi-conductor perovskite layer, the other of the hole transport layer or the electron transport layer and an inner translucent electrode layer; and electrical connectors connecting the junction box and each of the outer electrode and the inner electrode;
  an adherent layer, wherein the translucent photovoltaic stack is adhered to the upper surface of the near end-of-life or end-of-life silicon solar module with the adherent layer and the near end-of-life or end-of-life silicon solar module is in electrical communication with the junction box.

In the enhanced solar collector, the semiconductor perovskite layer may be tuned to convert energy in a band gap of 1.2 eV to 2.3 eV.

The enhanced solar collector may further comprise a frame which retains the near end-of-life or end-of-life silicon solar module and the glass perovskite photovoltaic system.

The enhanced solar collector may be configured for concomitant light conversion in the translucent photovoltaic stack and the near end-of-life or end-of-life silicon solar module.

The enhanced solar collector may further comprise a glass layer on top of the glass junction box layer, wherein the glass layer is curved to provide a convex surface.

In another embodiment, a method of enhancing a near end-of-life or end-of-life silicon solar module in situ is provided, the method comprising:

manufacturing a glass perovskite photovoltaic system, the glass perovskite photovoltaic system comprising a translucent photovoltaic stack which includes, in order, an outer translucent electrode layer which includes an upper surface, one of an electron transport layer or a hole transport layer, a semi-conductor perovskite layer, the other of the hole transport layer or the electron transport layer and an inner translucent electrode layer; a glass junction box layer which is located on the upper surface and includes a junction box; and electrical connectors connecting the junction box to each of the outer translucent electrode layer and the inner translucent electrode layer;

adhering the translucent photovoltaic stack to an upper surface of the near end-of-life or end-of-life silicon solar module in situ; and electrically connecting the junction box to the near end-of-life or end-of-life silicon solar module, thereby enhancing the near end-of-life or end-of-life silicon solar module in situ.

The method may further comprise tuning the semiconductor perovskite layer convert energy in a band gap of 1.2 eV to 2.3 eV prior to manufacturing the glass perovskite photovoltaic system.

The method may further comprise framing the glass perovskite photovoltaic system and the near end-of-life or end-of-life silicon solar module with a frame.

The method may further comprise locating a convex glass layer on top of the translucent photovoltaic stack and retaining the convex glass layer with the frame.

FIGURES

Figure 6:
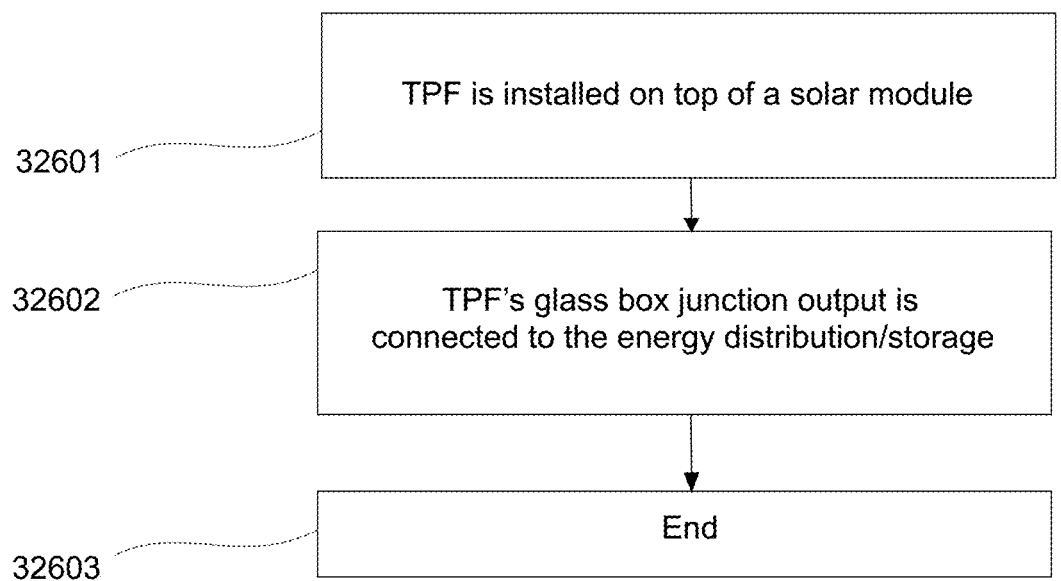

FIG. 6 displays a flowchart that explains the step-by-step process to install the photovoltaic film system on a solar panel in situ.

Figure 7:
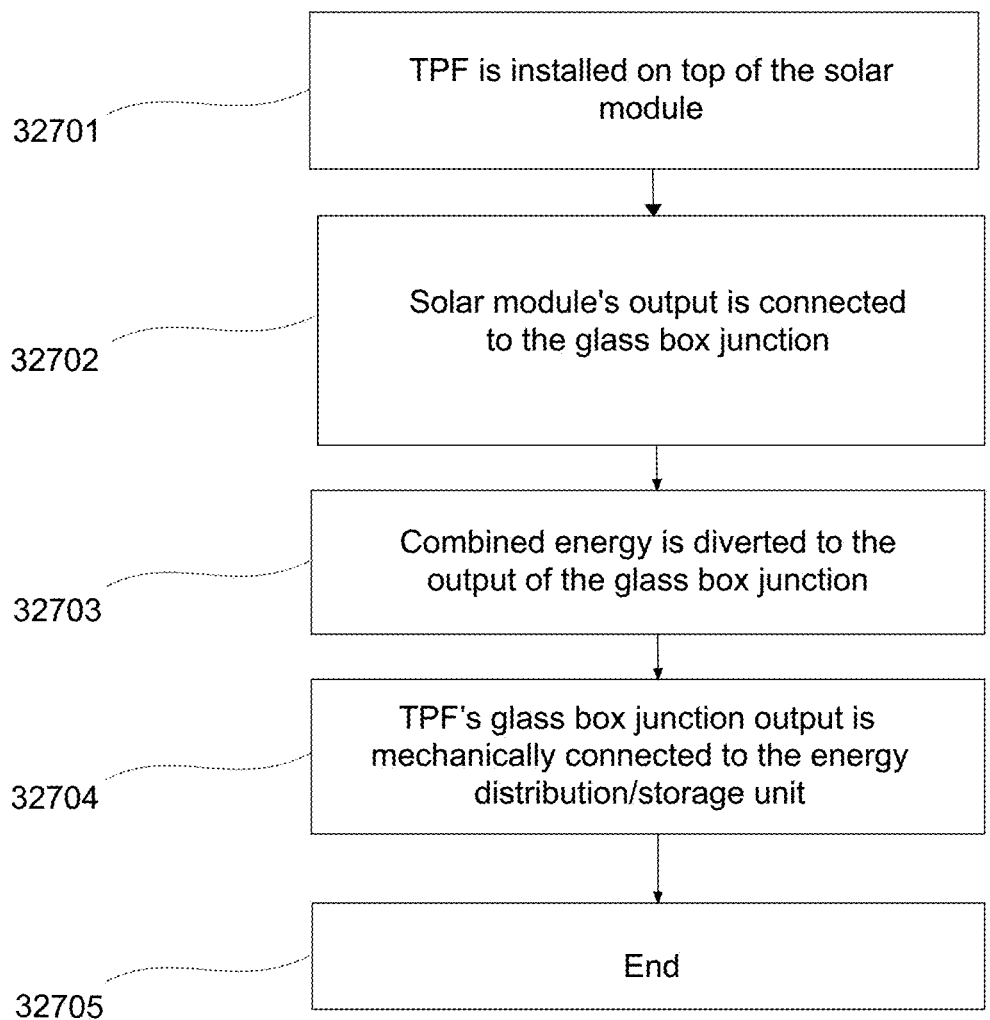

FIG. 7 is a flowchart consisting of the step-by-step process to install a photovoltaic film system on a deployed solar panel in situ.

Figure 8:
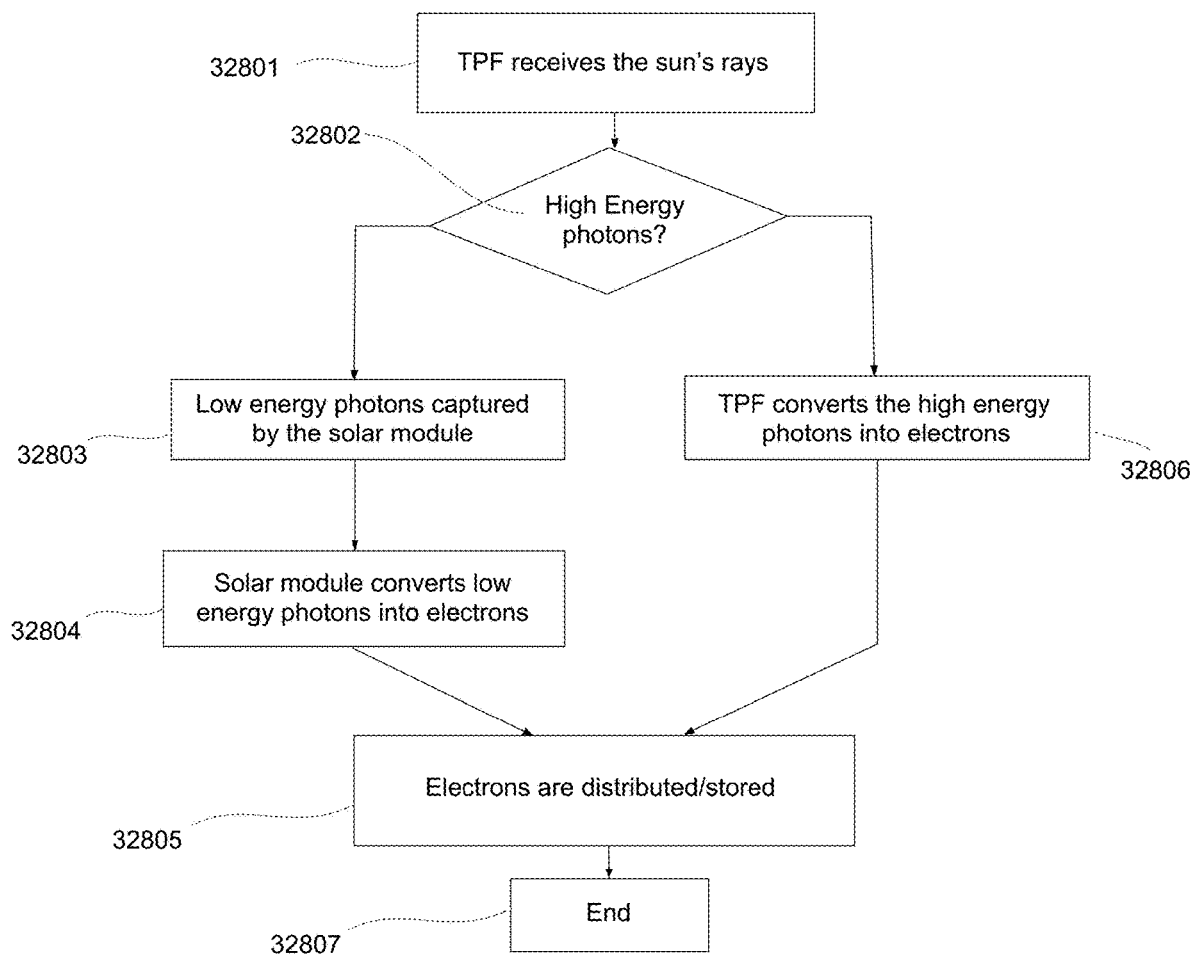

FIG. 8 is a flowchart that explains the steps that occur after the solar collector of the near end-of-life solar panel and the photovoltaic film system receives the sun's rays.

Figure 9A:
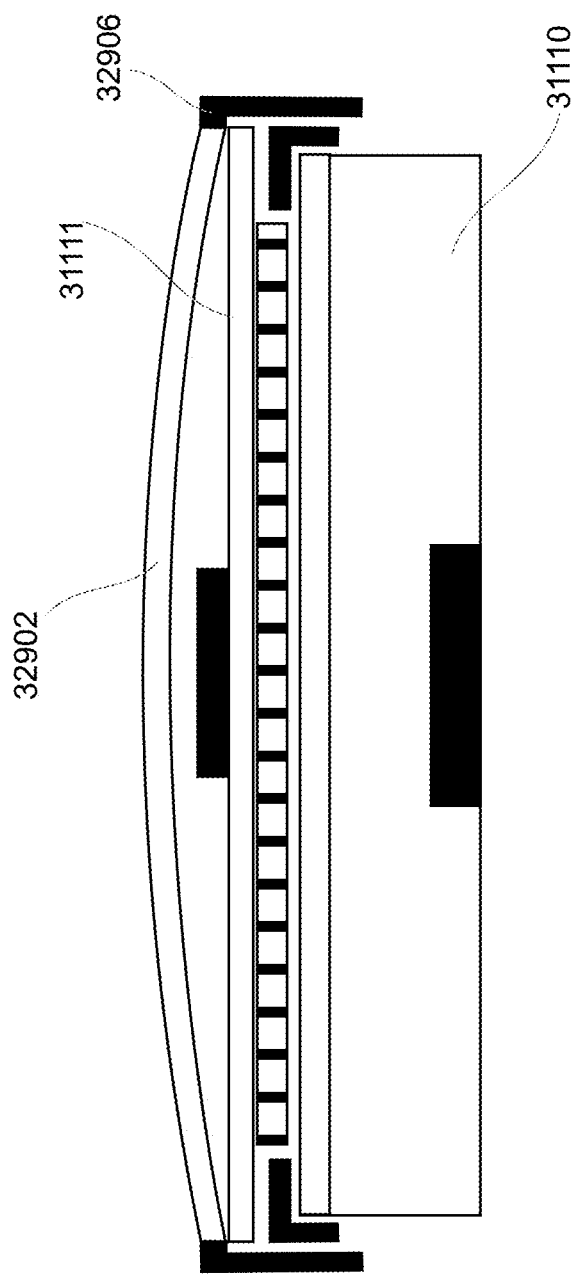

FIG. 9A shows an alternative embodiment of the present technology with a curved cover.

Figure 9B:
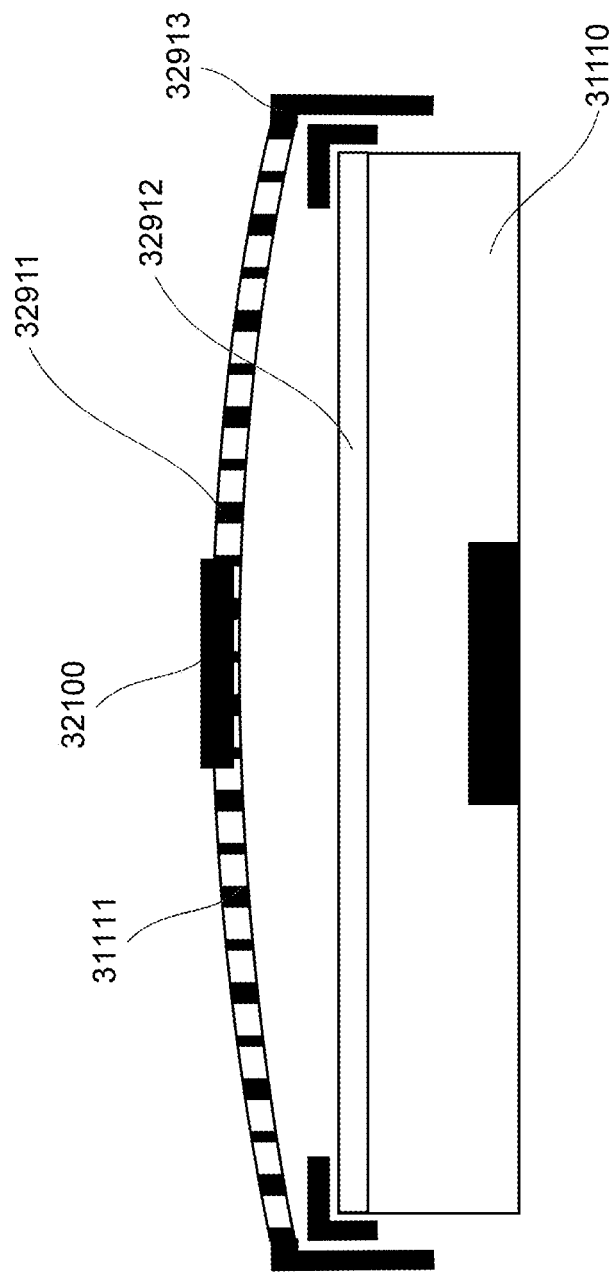

FIG. 9B is another alternative embodiment, with a curved perovskite layer.

Figure 10:
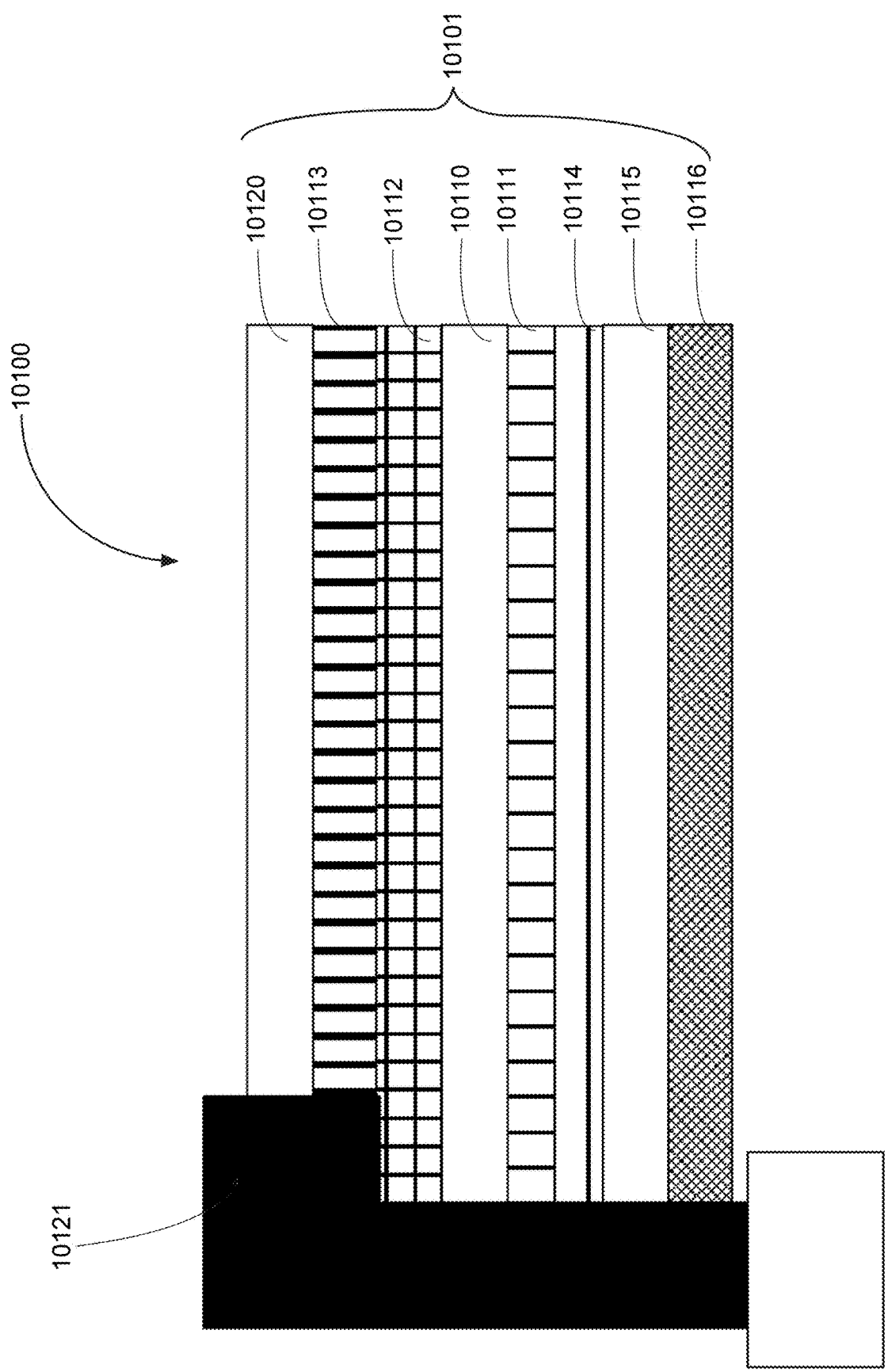

FIG. 10 is a cross-sectional view of the glass perovskite photovoltaic system of the present technology.

Figure 11A:
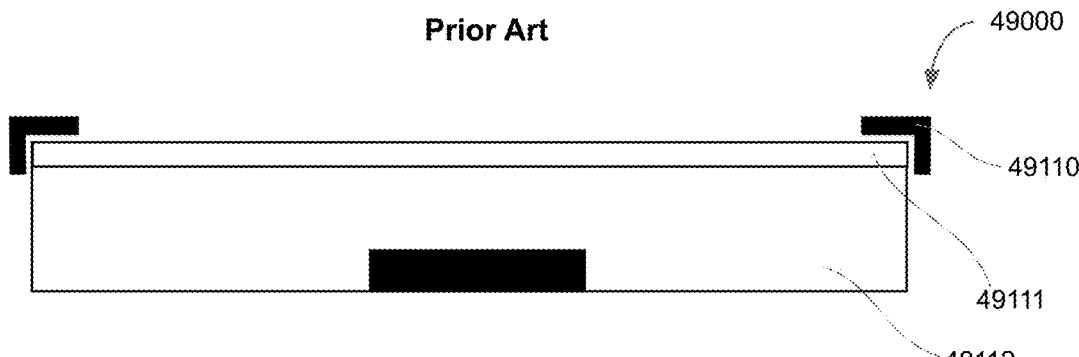

FIG. 11A is a side view of a prior art solar module.

Figure 11B:
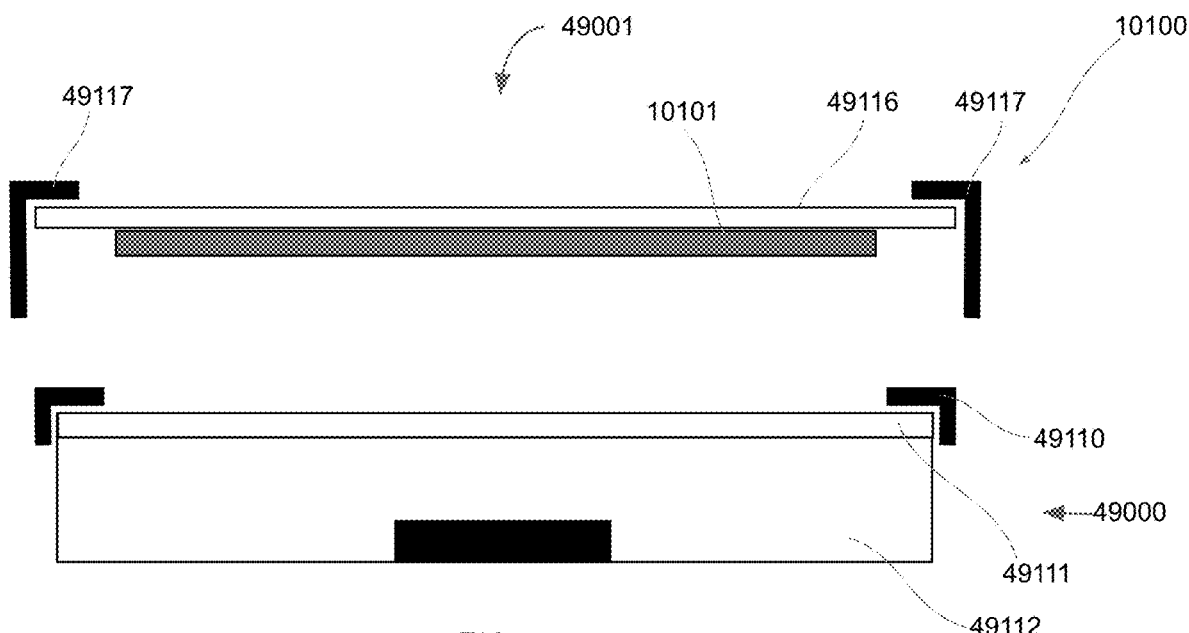

FIG. 11B is a side view of the same solar module as FIG. 11A with the glass perovskite photovoltaic system being deployed.

Figure 11C:
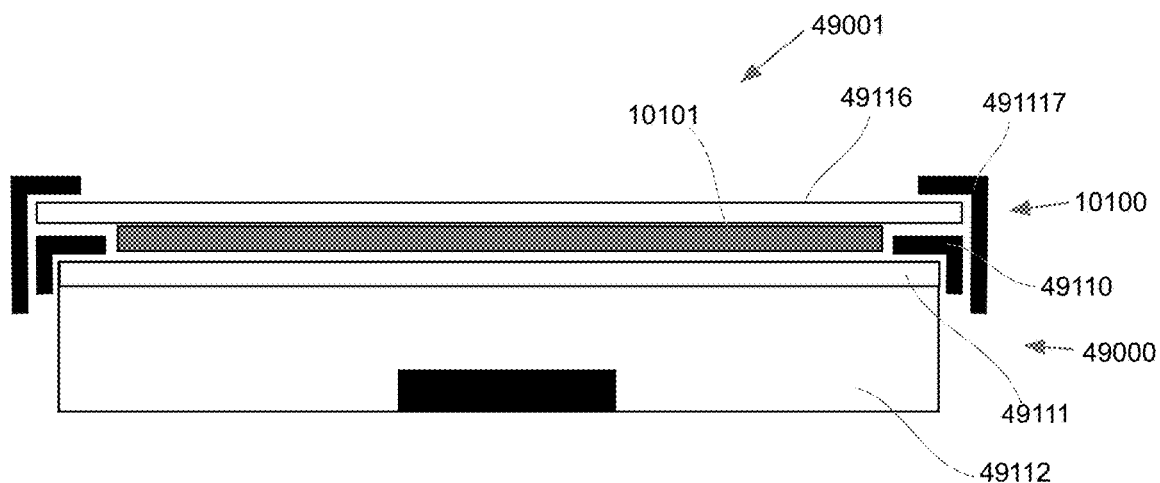

FIG. 11C is a side view of the glass perovskite photovoltaic system of the present technology located on the solar module.

Figure 11D:
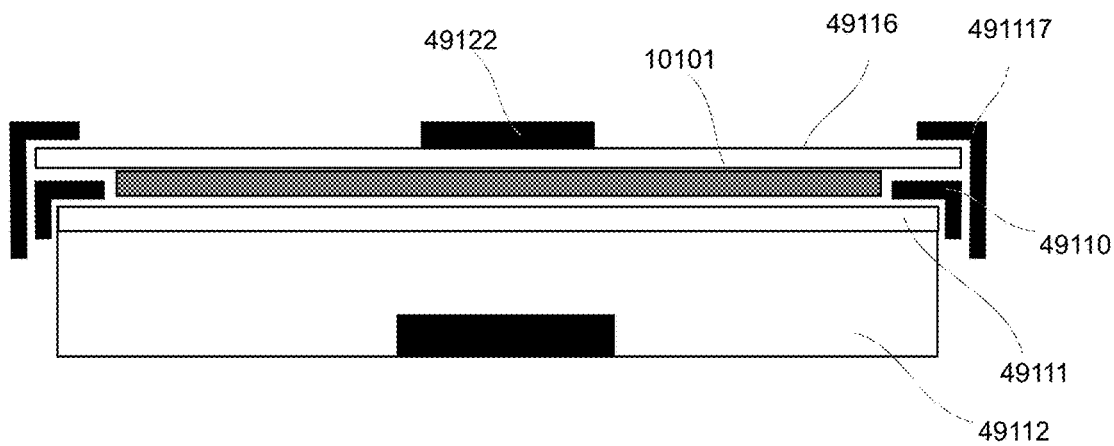

FIG. 11D is an alternative embodiment of the present technology.

Figure 12:
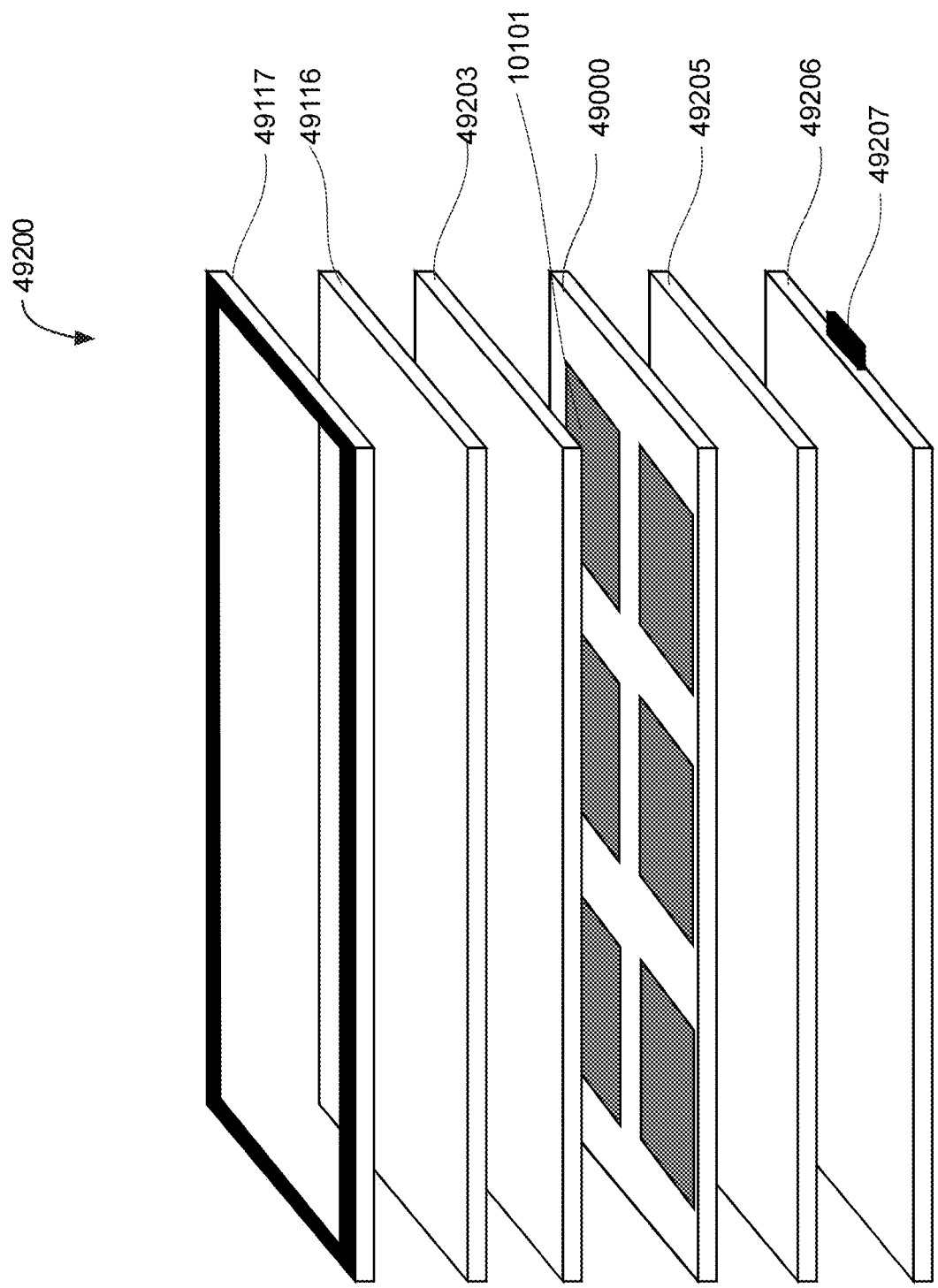

FIG. 12 is an alternative embodiment of the technology.

Figure 13:
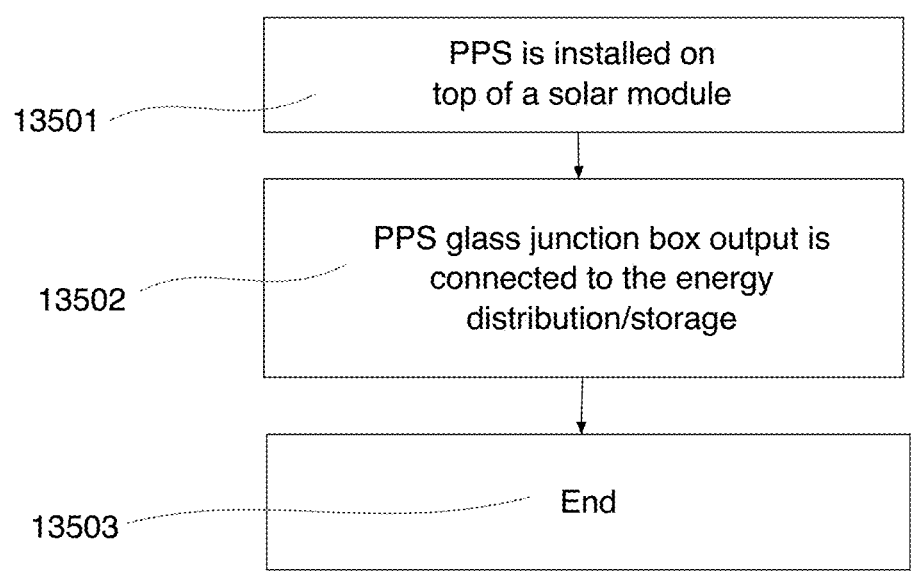

FIG. 13 is a flow chart of the steps in assembling the enhanced solar collector.

Figure 14:
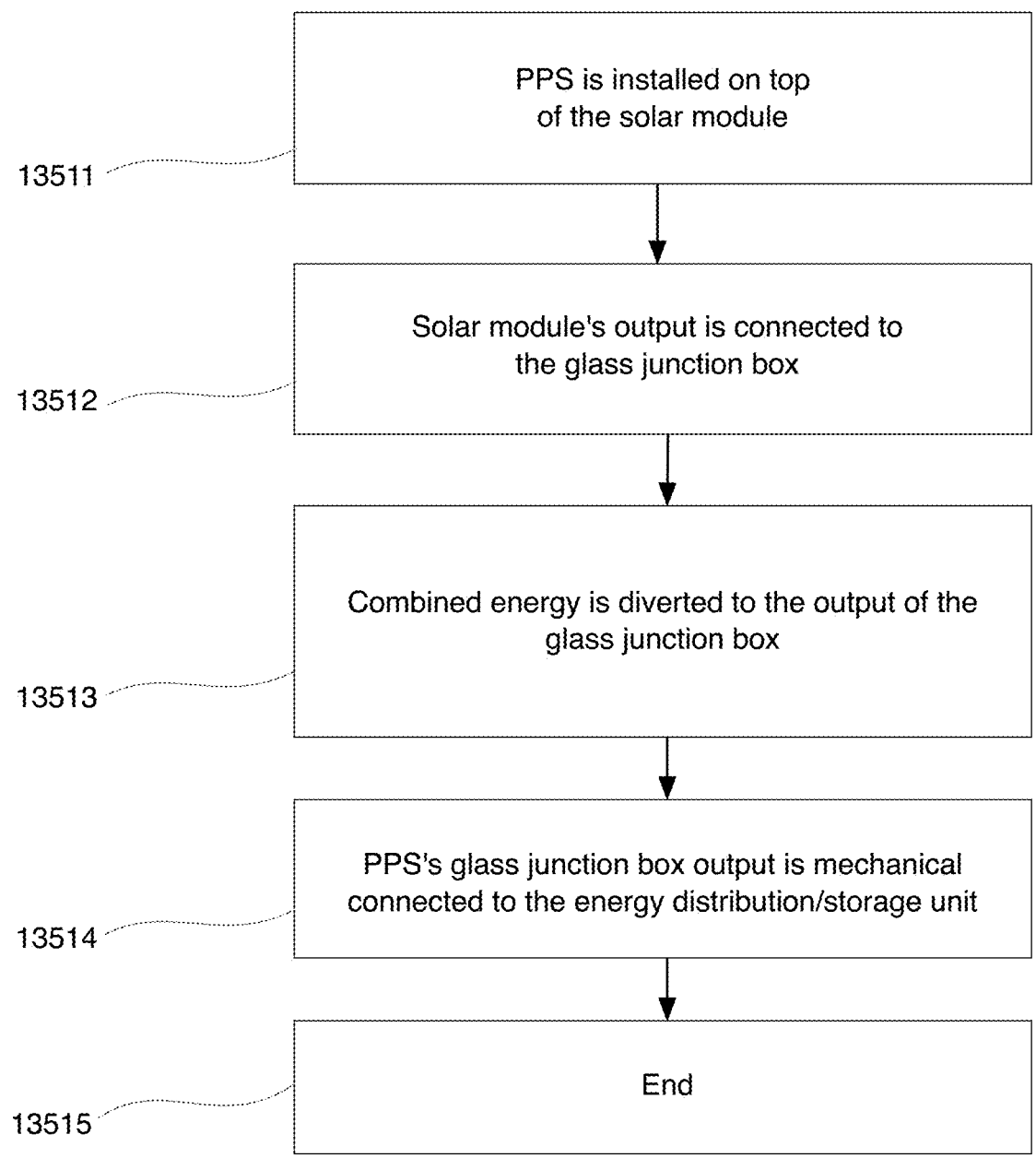

FIG. 14 is a flow chart of the steps in assembling an alternative embodiment enhanced solar collector.

Figure 15:
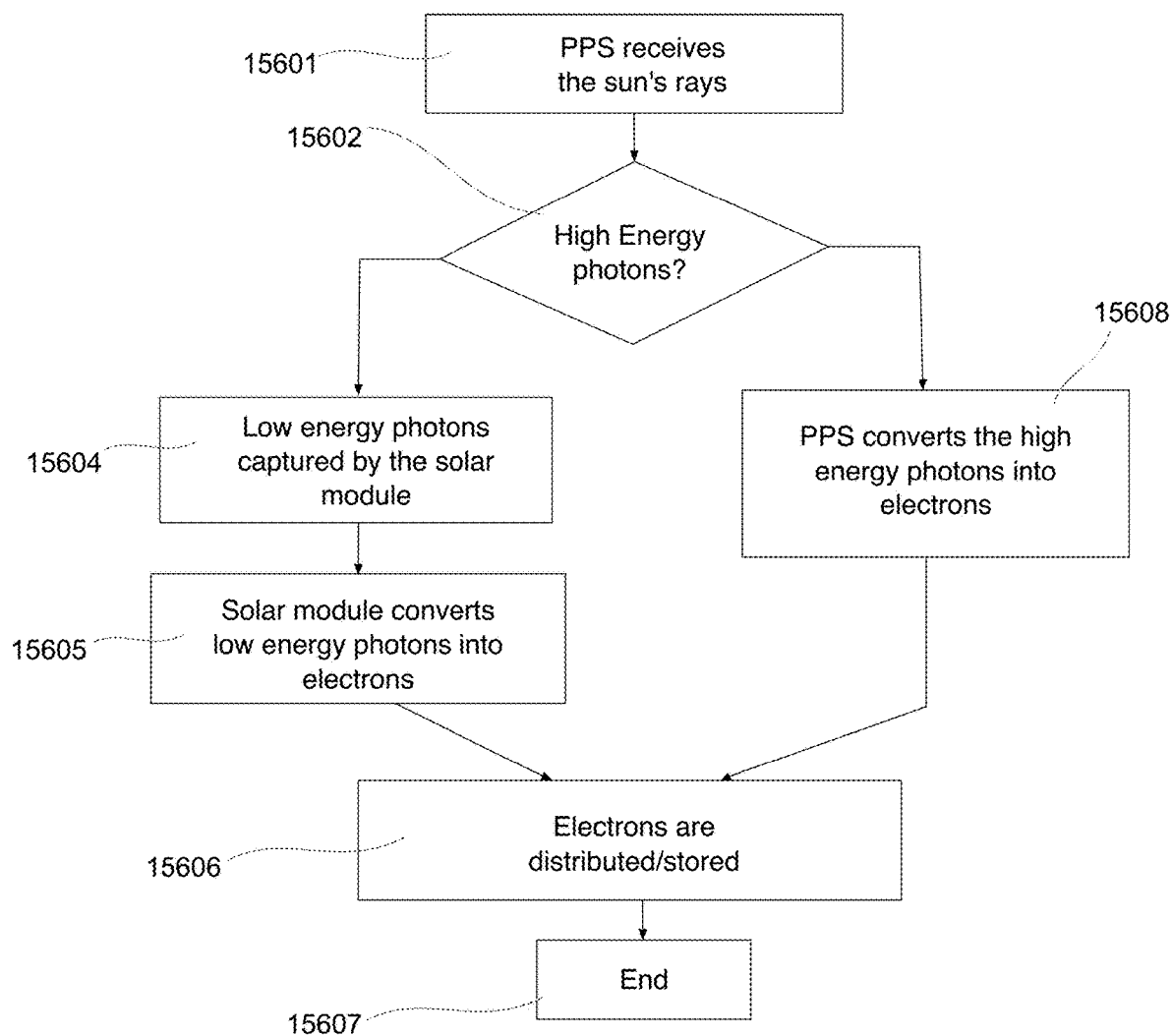

FIG. 15 is a flowchart that describes the operation of the system of the present technology.

Figure 16:
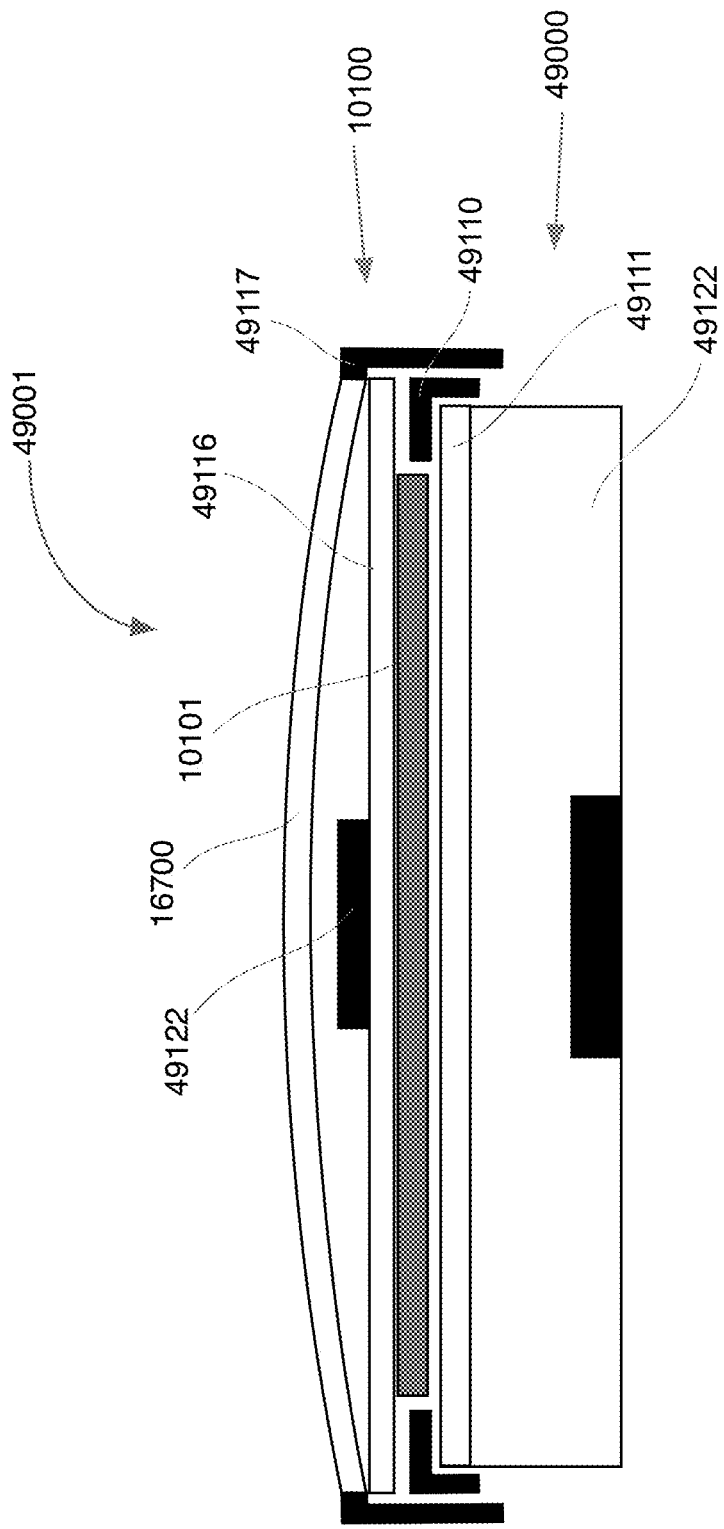

FIG. 16 is a side cross-sectional view of an alternative embodiment.

Figure 17:
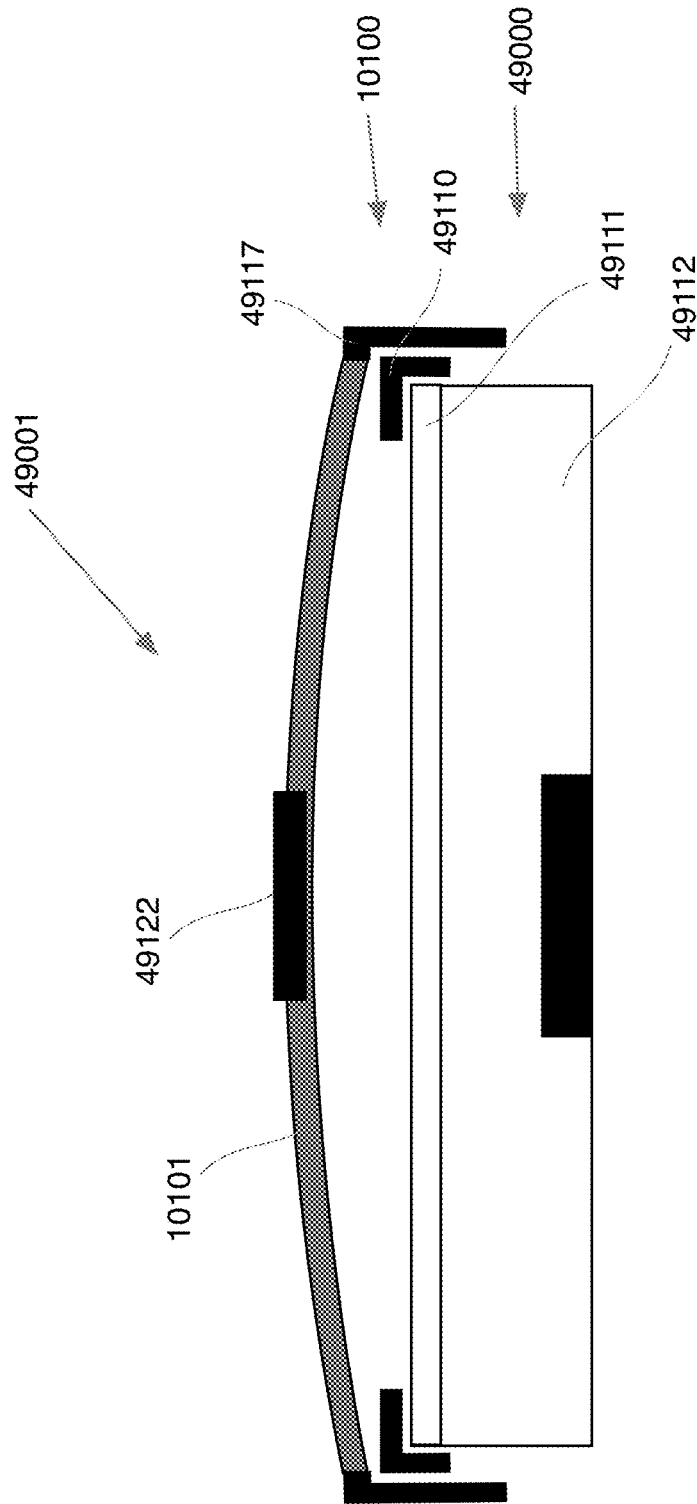

FIG. 17 is a side cross-sectional view of another alternative embodiment.

Figure 18:
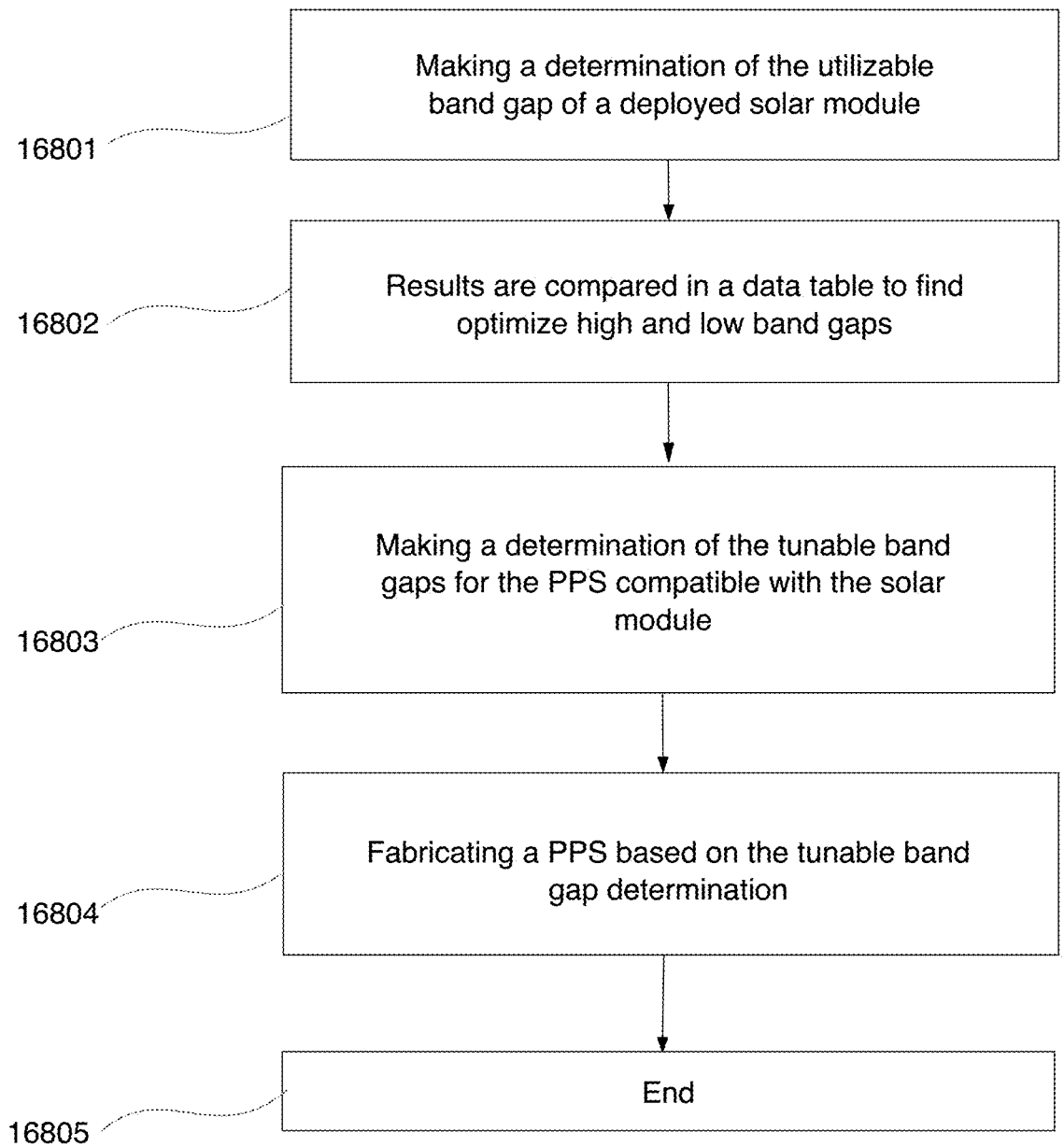

FIG. 18 is a flowchart describing the method to determine the characteristics of the glass perovskite photovoltaic system.

DESCRIPTION

Except as otherwise expressly provided, the following rules of interpretation apply to this specification (written description and claims): (a) all words used herein shall be construed to be of such gender or number (singular or plural) as the circumstances require; (b) the singular terms "a", "an", and "the", as used in the specification and the appended claims include plural references unless the context clearly dictates otherwise; (c) the antecedent term "about" applied to a recited range or value denotes an approximation within the deviation in the range or value known or expected in the art from the measurements method; (d) the words "herein", "hereby", "hereof", "hereto", "hereinbefore", and "hereinafter", and words of similar import, refer to this specification in its entirety and not to any particular paragraph, claim or other subdivision, unless otherwise specified; (e) descriptive headings are for convenience only and shall not control or affect the meaning or construction of any part of the specification; and (f) "or" and "any" are not exclusive and "include" and "including" are not limiting. Further, the terms "comprising," "having," "including," and "containing" are to be construed as open-ended terms (i.e., meaning "including, but not limited to,") unless otherwise noted.

Recitation of ranges of values herein are merely intended to serve as a shorthand method of referring individually to each separate value falling within the range, unless otherwise indicated herein, and each separate value is incorporated into the specification as if it were individually recited herein. Where a specific range of values is provided, it is understood that each intervening value, to the tenth of the unit of the lower limit unless the context clearly dictates otherwise, between the upper and lower limit of that range and any other stated or intervening value in that stated range, is included therein. All smaller sub ranges are also included. The upper and lower limits of these smaller ranges are also included therein, subject to any specifically excluded limit in the stated range.

Unless defined otherwise, all technical and scientific terms used herein have the same meaning as commonly understood by one of ordinary skill in the relevant art. Although any methods and materials similar or equivalent to those described herein can also be used, the acceptable methods and materials are now described.

Definitions

End-of-life—in the context of the present technology, end-of-life means that the solar panel has decreased its light conversion efficiency by at least 12%.

Near end-of-life—in the context of the present technology, near end-of-life means that the solar panel has decreased its light conversion efficiency by at least 5% and less than 12%.

Solar collector—in the context of the present technology, a solar collector is the combination of the photovoltaic film system and an end-of-life or near end-of-life solar panel.

Restored—in the context of the present technology, restored means that the light conversion efficiency of the end-of-life or near end-of-life solar panel is increased by at least 4%.

Enhanced solar collector—in the context of the present technology, an enhanced solar collector is the combination of the glass perovskite photovoltaic system and an end-of-life or near end-of-life solar silicon module.

Enhanced—in the context of the present technology, enhanced means that the light conversion efficiency of the end-of-life or near end-of-life silicon solar module is increased by at least 4%.

Film—in the context of the present technology, a film is a plastic polymeric layer with a thickness of 4 millimeters or less. It is flexible.

DETAILED DESCRIPTION

Figure 1:
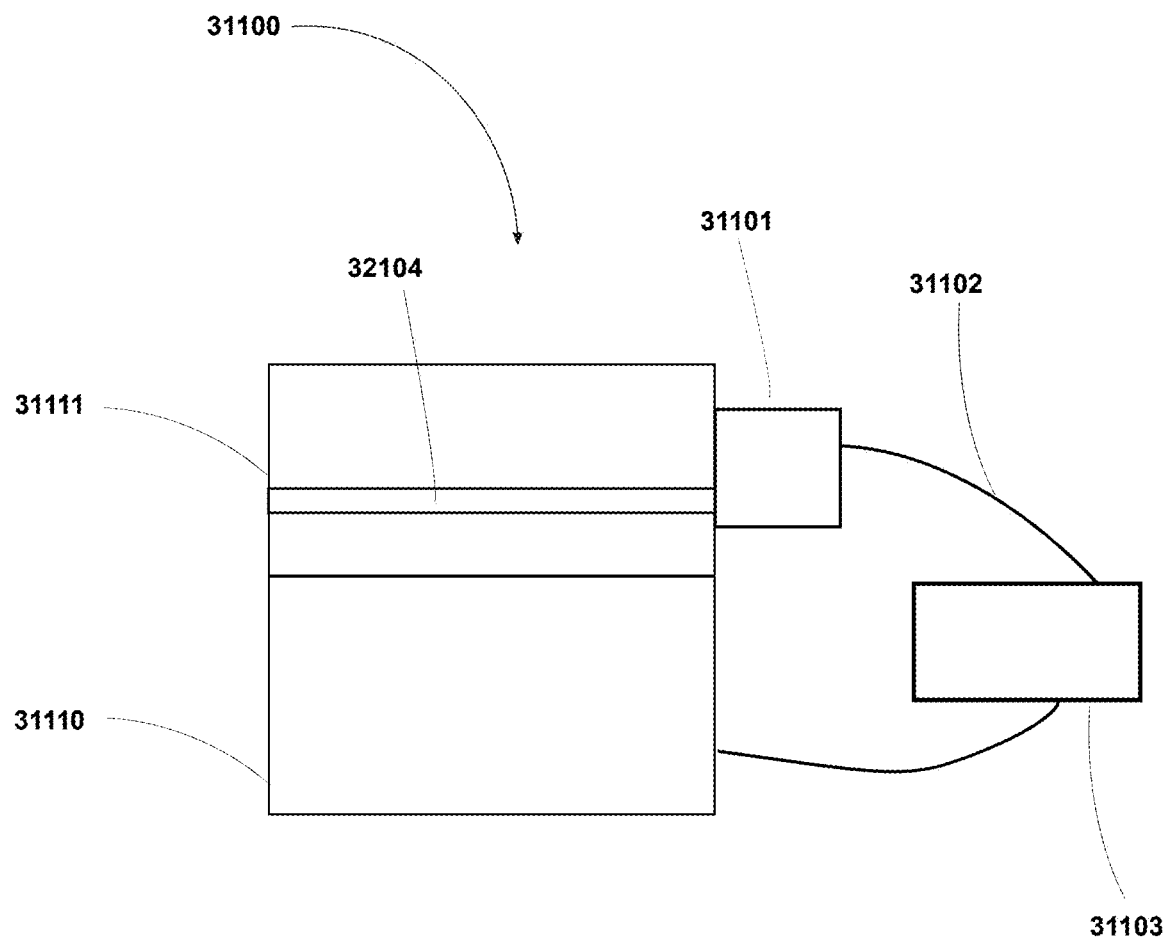
FIG. 1 is a diagram of a photovoltaic film system of the present technology.

FIG. 1 is a diagram of a photovoltaic film system generally referred to as (31100) that retrofits old solar panels and displays how it interacts with previously installed solar panels (31110). The translucent photovoltaic film stack (31111) of the system can be installed on the upper surface of an existing solar panel (31110), for example, a previously installed solar panel with more than 10 years of use. The photovoltaic film system (31100) includes: the translucent photovoltaic film (TPF) stack 31111, which includes a semi-conductor layer (32104) of perovskite crystals tuned to band gaps of 1.2 electron Volts (eV) to 2.3 eV and an adhesive layer; a connector (31101); at least one cable (31102) that is attached to the connector 31101; and an inverter 31103 which is connected to the cable 31102. The inverter 31103 accepts the electric energy input from the translucent photovoltaic film stack (31111) as well as from the solar panel (31110); wherein the inverter (31103) balances the loads coming from the solar panel (31110) and the first translucent photovoltaic film stack (31111). In a second embodiment of the present technology the translucent photovoltaic film stack (31111) is tuned to convert energy in the 1.2 eV to 2.3 eV band gaps. Note that silicon has a band gap between 1.1 to 1.6 eV, while perovskites have a tunable bandgap. Adjusting the band gap to between 1.6 to 2.6 eV results in the solar collector harvesting a larger light spectrum. This also allows for low energy photons being harvested by the solar panel 31110 and the higher energy photons being harvested by the translucent photovoltaic film stack 31111.

One familiar with the art will appreciate that a second photovoltaic film system tuned to convert energy from a different band gap as the first photovoltaic film system (31100) could be added to the first translucent film, where, this combination of two translucent photovoltaic films extends the spectrum or range of solar electron band gaps that can be converted to electricity thus collecting higher amounts of energy, which is then transmitted, from each of the photovoltaic films to the inverter (31103).

Figure 2:
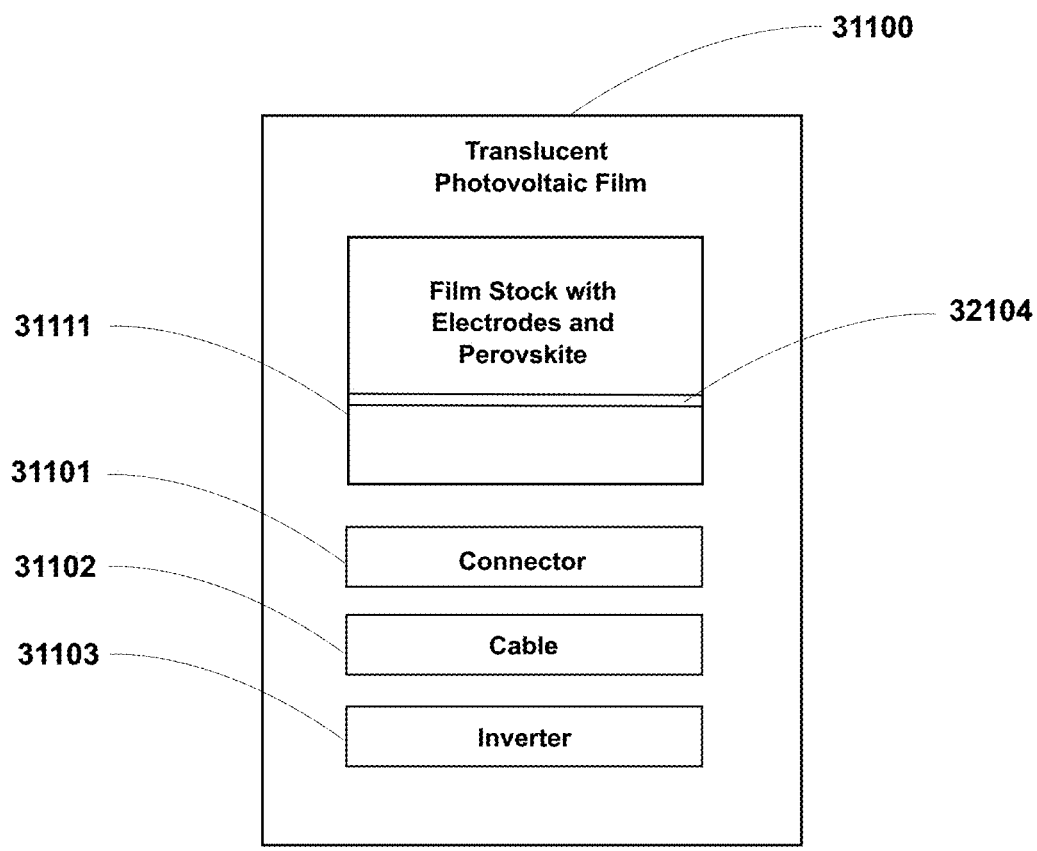
FIG. 2 shows a block diagram of the various components that constitute a photovoltaic film system.

FIG. 2 is a block diagram of the various components that constitute a photovoltaic film system 31100 pertaining to the present technology. The photovoltaic film system (31100) comprises a stack of films 31111 which includes translucent electrodes and a semiconductor (32104), which in the preferred embodiment is a perovskite layer.

Figure 3A:
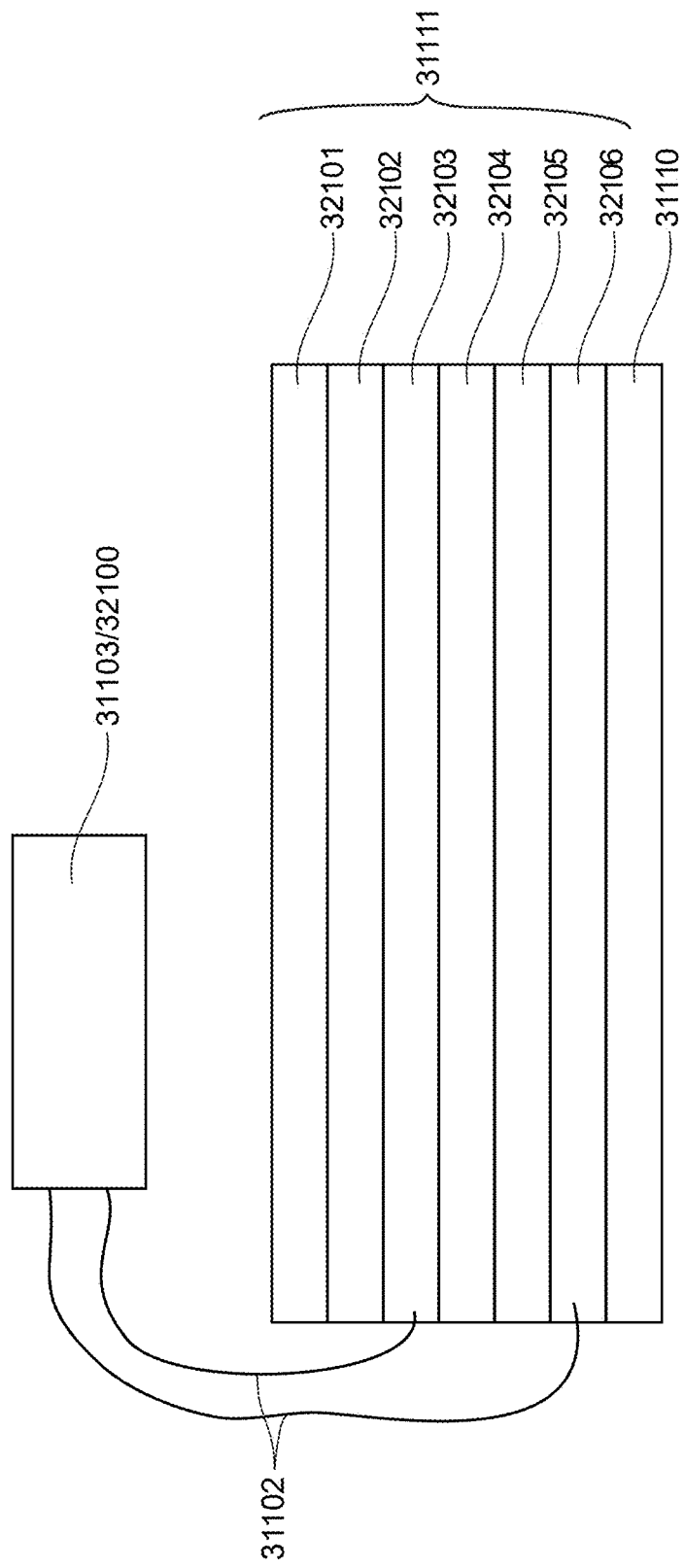
FIG. 3A shows a side view of the translucent photovoltaic film stack.

FIG. 3A is a side view of the translucent photovoltaic film layers (32101, 32102, 32103, 32104, 32105, 32106) of the photovoltaic film stack 31111 on top of a deployed solar panel (31110), wherein the solar panel (31110) is electrically connected to the power inverter (31103). The translucent photovoltaic film stack 31111 is manufactured such that: a semiconductor (32104), for example a perovskite layer, is sandwiched between hole transport and electron transport layers (32103, 32105), which are bonded to transparent or translucent electrodes (32106, 32102). A protective layer 32101 is laid on as the uppermost layer. An adherent is applied to the lower electrode 32106. It therefore is between the lower electrode 32106 and the solar panel 31110 and forms a layer of the photovoltaic film stack 31111. In another embodiment, an adherent is applied to the lower electrode and/or the upper surface of the solar panel 31110 during the process of restoring the solar panel 31110. One familiar with the art will appreciate that during exposure to sunlight, the semiconductor or perovskite layer firstly absorbs photons to produce excitons (electron-hole pairs). Due to the difference in the exciton binding energy of the perovskite materials, these excitons can form free carriers (free electrons and holes) to generate a current or can recombine into excitons.

Continuing with the description of FIG. 3A, the top layer is also optically bonded to the protection or encapsulation layer. Both electrodes (32102 and 32106) are electrically connected, via cables (31102) to the inverter (31103). In alternative embodiment, the electrodes are each connected to a junction box (32100). One familiar with the art will appreciate that a power inverter, inverter, solar inverter or PV inverter, is a type of electrical converter which converts the variable direct current (DC) output of a photovoltaic (PV) solar panel into a utility frequency alternating current (AC) that can be fed into a commercial electrical grid or used by a local, off-grid electrical network. It is a critical balance of system (BOS)-component in a photovoltaic system, allowing the use of ordinary AC-powered equipment.

Figure 3B:
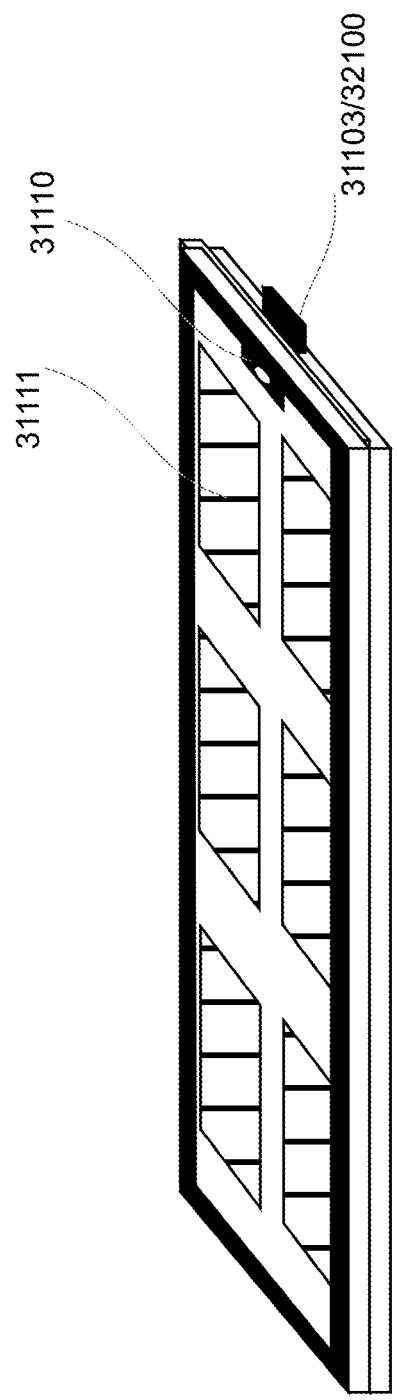
FIG. 3B is a top perspective view of the solar panel with the translucent photovoltaic film stack attached to a solar panel provide the solar collector of the present technology.

FIG. 3B is a top perspective view of the solar panel (31110) with the photovoltaic film layer stack 31111 of the present technology located on the upper surface, showing the inverter (31103). or junction box (32100).

Figure 4A:
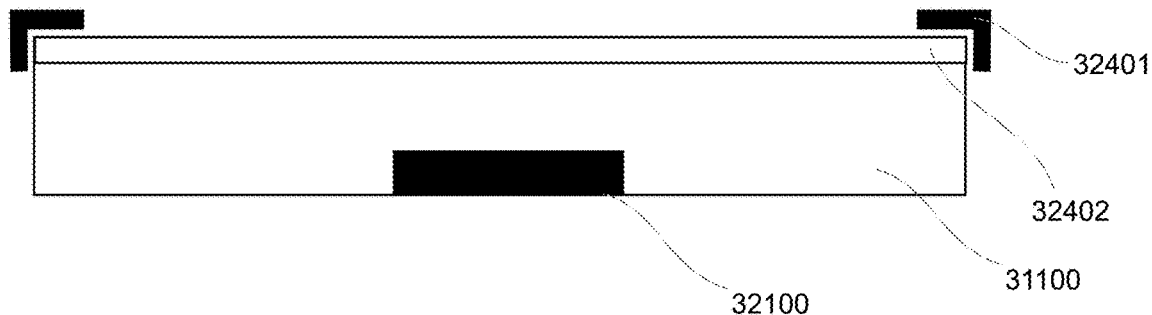
FIG. 4A shows a side view of a prior art solar panel with a top protection.

FIG. 4A is a side view of a prior art solar panel (31110) with a top protection or glass (32402) encased in a frame (32401). Also shown is a junction box (32100). One familiar with the art will appreciate that this is the basic setup of a solar panel that is installed in a rooftop or a solar farm.

Figure 4B:
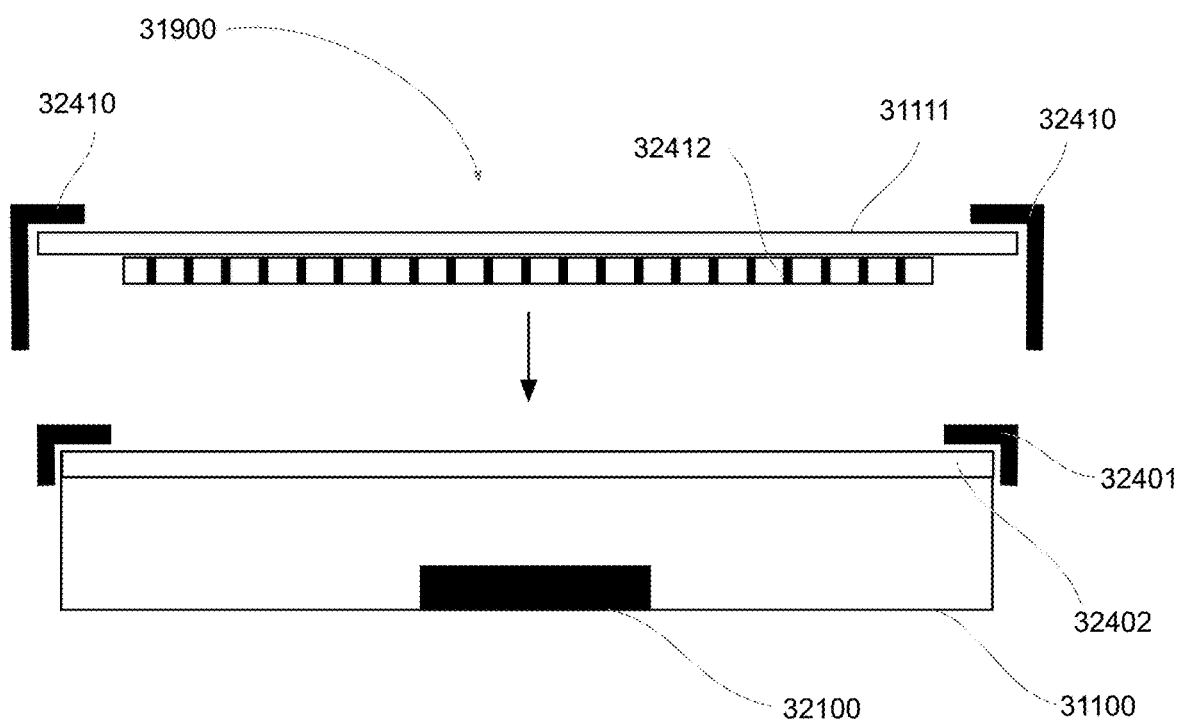
FIG. 4B shows a side view of the same solar panel as FIG. 4A with the photovoltaic film system being deployed.

FIG. 4B is a side view of the solar panel 31100 showing how the translucent photovoltaic film stack 31111 of the photovoltaic film system (31100) can be overlaid on the upper surface of the solar panel (31110), to provide the solar collector 31900 of the present technology. In this embodiment, the translucent photovoltaic film stack 31111 is bonded to a bottom substrate (32412) that can also be bonded to the glass (32402) of the solar panel (31110). The entire apparatus can then be encased in a frame (32410), which retains the junction box 32100, or in another embodiment, the inverter 31103. In this manner, the solar panel is restored in situ.

Figure 4C:
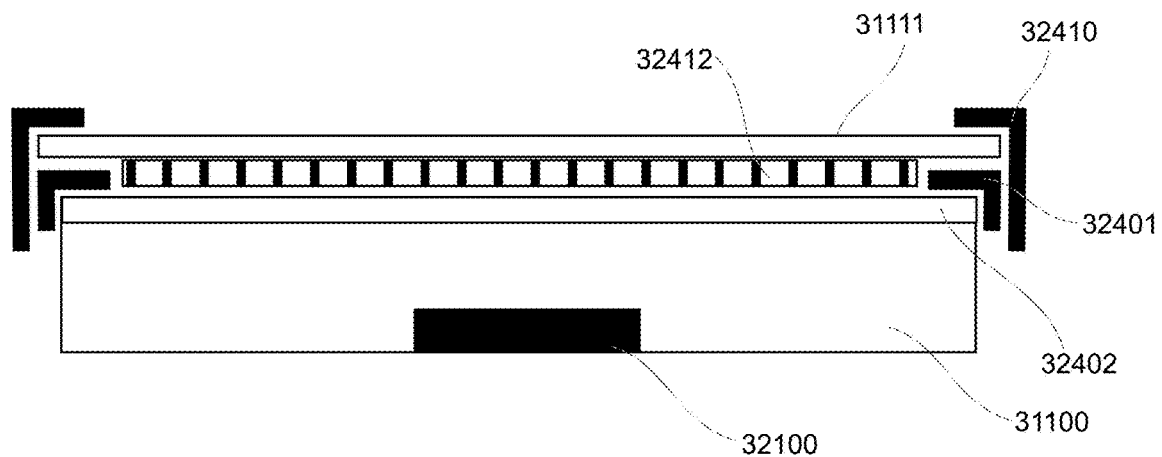
FIG. 4C shows a side view of the photovoltaic film system of the present technology located on the solar panel.

FIG. 4C is a side view of the translucent photovoltaic film stack 31111 of the present technology bonded to a bottom substrate (32412), which is bonded to glass (32402) of the solar panel (31110) to provide the solar collector 31900. The combination is retained in an external frame (32410), and an internal frame (32401).

Figure 4D:
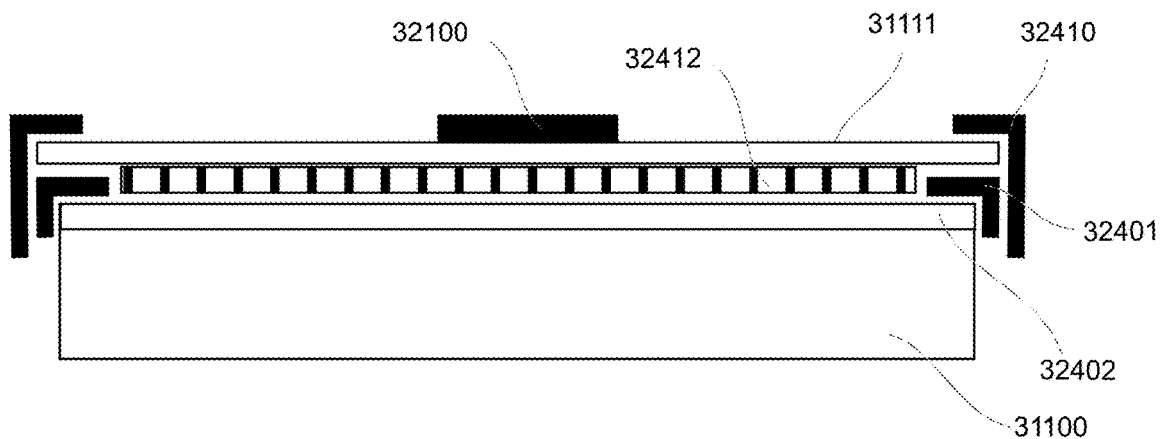
FIG. 4D shows an alternative embodiment of the present technology.

FIG. 4D is an alternative embodiment of the present technology from FIG. 4C, where a junction box, inverter or control box (32100) is installed on top of the translucent photovoltaic film stack 31111.

Figure 5:
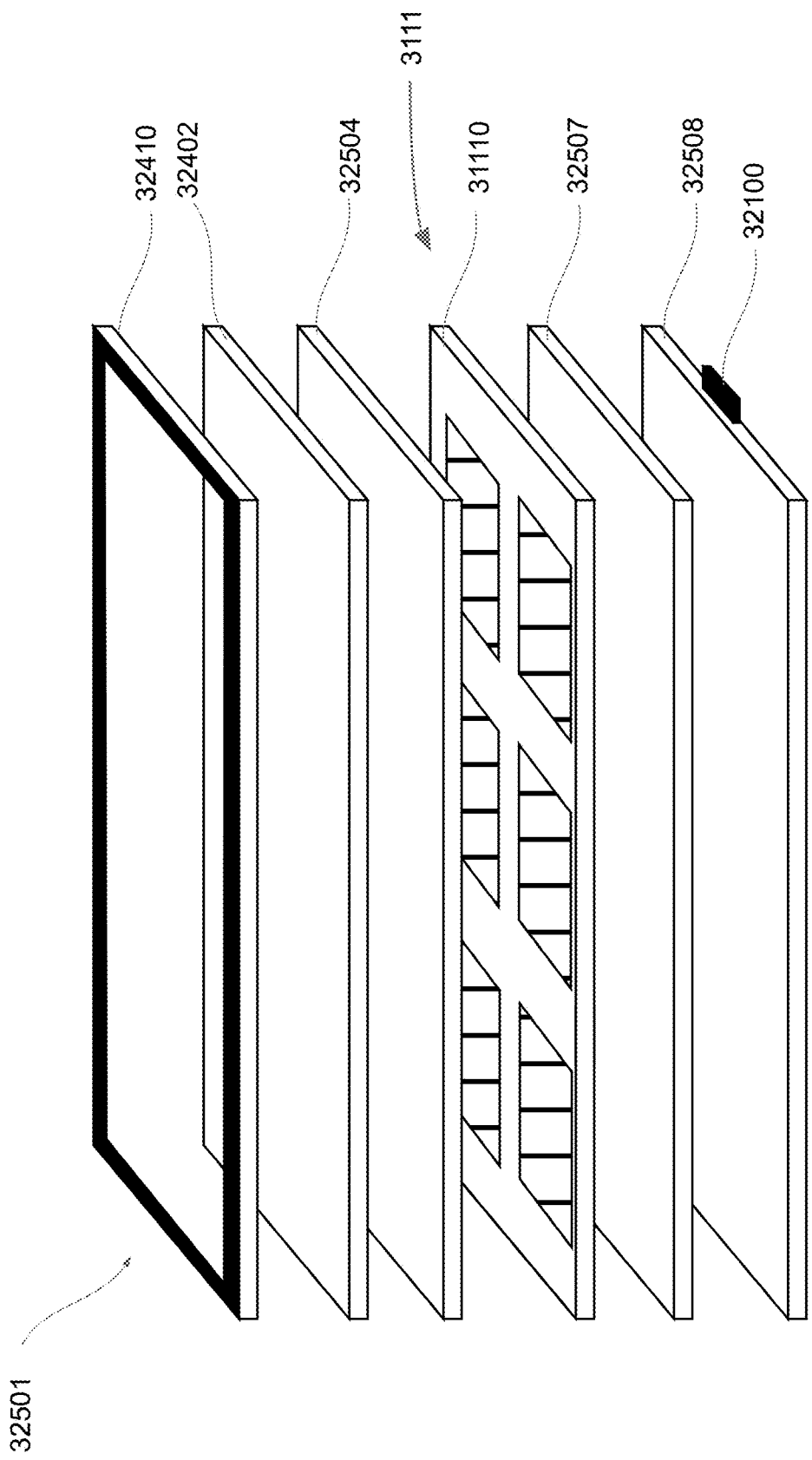
FIG. 5 shows an alternative embodiment of the solar collector of the present technology.

FIG. 5 is an alternative embodiment of the solar collector, generally referred to as 32501, which includes the frame (32410), the glass layer (32402), the encapsulant (32504), the layer consisting of the solar panel (31110), the translucent photovoltaic film stack 31111, the bottom encapsulant layer (32507), and the back sheet (32508). The junction box (32100) is attached to the side.

FIG. 6 displays a flowchart that explains the step-by-step process to install the photovoltaic film system to the end-of-life or near-end-of-life solar panel (31110) in situ. One familiar with the art will appreciate that this process can also be applied to new solar panels.

Step 1 (32601)—TPF stack is installed on top of a solar module. It is recommended that when installing the surface of the already deployed solar panel must be clean. The solution works with or without bonding, however, an adhesive layer ensures that the translucent photovoltaic film stack 31111 adheres to the surface of the solar panel.

Step 2 (32602)—The photovoltaic film system's glass box junction output is connected to the energy distribution/storage for energy distribution.

Step 3 (32603)—End.

FIG. 7 is a flowchart consisting of the step-by-step process to install a photovoltaic film system on top of an end-of-life or near-end-of-life solar module.

Step 1 (32701)—TPF stack is installed on top of a solar module. It is recommended that when installing the surface of the end-of-life or near-end-of-life solar panel must be clean. The solution works with or without bonding, however, an adhesive layer ensures that the translucent photovoltaic film stack 31111 adheres to the surface of the solar panel.

Step 2 (32702)—Solar module's output is connected to the glass box junction.

Step 3 (32703)—Combined energy is diverted to the output of the glass box junction.

Step 4 (32704)—photovoltaic film system's glass box junction output is electrically connected to the energy distribution/storage unit.

Step 5 (32705)—End.

FIG. 8 is a flowchart that explains the steps that occur after the solar collector receives the sun's ray when installed. The near end-of-life solar panel and the photovoltaic film system concomitantly collect solar energy which is transferred to the inverter wherein the inverter balances the loads coming from the solar panel and the translucent photovoltaic film stack.

Step 1 (32801)—TPF stack receives the sun's rays. One familiar with the art will appreciate that the sunrays transport photons of different wavelengths. Sunlight is broken down into three major components: visible light, with wavelengths between 0.4 and 0.8 micrometre, ultraviolet light, with wavelengths shorter than 0.4 micrometre, and infrared radiation, with wavelengths longer than 0.8 micrometre. The visible portion constitutes nearly half of the total radiation received at the surface of Earth.

Step 2 (32802)—Depending on the type of photon, high energy or low energy, they will pass through different solar modules.

If the incoming photons are low energy then:

Step 3 (32803)—The low energy photons pass through the translucent photovoltaic film stack 31111 to the solar panel 31100 where they are captured. Low energy photons are generated by sunlight with longer wavelengths.

Step 4 (32804)—Solar modules convert low energy photons into electrons. One familiar with the art can appreciate that in a standard photovoltaic (PV) cell, each photon causes one electron to be released inside the PV material. The electron then can be harnessed through wires to provide an electrical current.

Step 5 (32805)—The electrons are distributed or stored. The energy from the device can be transferred to an inverter which can then be used to charge other devices.

Step 7 (32807)—End.

If the incoming photons are high energy then:

Step 6 (32806)—The translucent photovoltaic film stack 31111 converts the high energy photons into electrons. One familiar with the art will appreciate that the high energy photons come from the shorter wavelengths of sunlight and import energy to free electrons in semiconductor material thereby generating direct current (DC) electricity.

Step 5 (32805)—The electrons are distributed or stored. The energy from the device can be transferred to an inverter which can then be used to charge other devices.

Step 7 (32807)—End.

FIG. 9A is an alternative embodiment of the solar collector of the present technology in which the solar panel (31110) with the translucent photovoltaic film stack 31111 is covered by a curved cover (32902) that helps protect the device. The curved cover (32902) is retained in a frame (32906). The curved cover (32902) also works as a solar collector by collecting the solar energy from another radius other than the flat solar panel.

FIG. 9B is another alternative embodiment of the solar collector in which the translucent photovoltaic film stack 31111 is curved, covers the solar panel 31110 and is encased in a frame (32913). The translucent photovoltaic film stack 31111 also has a junction box 32100 retained by the upper surface (32911). Through the embodiment of the present technology, the solar rays are able to directly have contact with the perovskite layer and harness the solar energy.

As shown in FIG. 10, a glass perovskite photovoltaic system, generally referred to as 10100 includes a translucent photovoltaic stack 10101 comprising a translucent semiconductor layer (10110) optically bonded to a hole transport layer (10111) and to an electron transport layer (10112). One familiar with the art will appreciate that the semiconductor material (10110) converts the photons into electron and hole pairs, sending them to the hole and electron transport layers (10111, 10112). In one embodiment of the technology, the translucent semiconductor material is halide perovskite material. The hole transport layer (10111) is bonded to a positive translucent electrode (10113) and the electron transport layer (10112) is bonded to the negative translucent electrode (10114).

The positive translucent electrode (10113) and the negative translucent electrode (10114) are electrically connected to a glass junction box layer (10120) which forms the outer layer of the glass perovskite photovoltaic system (10100). The glass junction box layer (10120) comprises a junction box 10121 which is connected to each of the negative translucent electrode 10114 and the positive translucent electrode 10113 with electrical connectors. In an alternative embodiment of the technology the translucent electrodes (11013, 10114) are mounted on a substrate such as glass or translucent or transparent polymer layer (10115). An optional adherent layer 10116 coats the glass or transparent polymer layer 10115.

The glass perovskite photovoltaic system 10100 is then mounted on top of a solar module. One familiar with the art will appreciate that by placing the glass perovskite photovoltaic system of the present technology on top of a conventional silicon solar module or silicon solar panel will help improve the energy conversion efficiency as the glass perovskite photovoltaic system captures certain wavelength of the incident light and allows unabsorbed light to pass through, which is then captured by the solar module. Both the solar module and the glass perovskite photovoltaic system 10100 of the present technology convert solar energy to electricity, resulting in an improvement in light conversion.

FIG. 11A is a side cross sectional view of a prior art silicon solar module 49000 showing the frame (49110), the solar module's glass (49111) and the solar module body (49112).

FIG. 11B is a side cross sectional view of the silicon solar module of FIG. 11A, with the glass perovskite photovoltaic system 10100 being installed on the upper surface to provide an enhanced solar collector, generally referred to as 49001. This is done in situ, so there is no need to remove the silicon solar module 49000. In one embodiment, the translucent photovoltaic stack 10101 is overlaid with a protective glass layer (49116). The glass layer 49116 may be mechanically attached to the translucent photovoltaic stack 10101 or a transparent adhesive may be used. The glass layer (49116) is supported by the frame (49117).

FIG. 11C is a side cross sectional view of the enhanced solar collector 49001.

FIG. 11D is the same side cross sectional view of the enhanced solar collector 49001 showing the glass junction box layer (49122) where all the electrical distribution components are located.

In an alternative embodiment of the technology, the glass junction box layer 49122 is located on one side of the stack 10101.

In one embodiment, the translucent semiconductor layer (10110) is tuned to have a band gap of the 1.2 electron Volts (eV) to 2.3 eV. Note that silicon has a band gap between 1.1 to 1.6 eV, while perovskites have a tunable bandgap. Adjusting the band gap to between 1.6 to 2.6 eV results in the enhanced solar collector 49001 harvesting a larger light spectrum. This also allows for low energy photons being harvested by the silicon solar module 49000 and the higher energy photons being harvested by the translucent semiconductor layer 10110. In an alternative embodiment, the translucent semiconductor layer 10110 is tuned to 1.1 to 1.6 eV, thus matching the band gap of the silicon solar module 49000. This also improves the light conversion efficiency.

FIG. 12 is a side perspective exploded view of an enhanced solar module (49200) comprising the frame 49117 that retains the glass layer 49116, an encapsulant 49203 that acts as a protective layer, the silicon solar module 49000 with the stack 10101 on top of the solar cells, a second encapsulant layer 49205 and a back sheet (49206). A glass junction box layer (49207) is in electrical communication with the silicon solar module 49000 and the stack 10101. In an alternative embodiment, the solar cells are removed and are replaced with the stack 10101.

FIG. 13 is a flowchart that describes the operation in one embodiment of the technology.

STEP 13501 Glass perovskite photovoltaic system 10100 (PPS) is installed on top of a silicon solar module 49000. One familiar with the art will appreciate that before bonding both units, the glass perovskite photovoltaic system 10100 with the solar module 49000, the areas of contact (mechanical or optical) need to be clean before installing them to provide the maximum light transmission possible.

STEP 13502 Glass perovskite photovoltaic system 10100 glass junction box layer (10120) is electrically connected to the energy distribution or energy storage unit.

FIG. 14 is a flowchart that describes the operation of an alternative embodiment of the technology where the energy coming from the solar module 49000 combined with the energy coming out of the glass perovskite photovoltaic system 10100.

STEP 13511 Glass perovskite photovoltaic system 10100 (PPS) is installed on top of a silicon solar module 49000.

STEP 13512 Solar module's output is connected to the junction block (10120).

STEP 13513 Glass perovskite photovoltaic system 10100 (PPS) energy and the solar module 49000 energy flow to the glass junction box layer (10120).

STEP 13514 Glass perovskite photovoltaic system 10100 (PPS) glass junction box layer 10120 output is electrically connected to the energy distribution or energy storage unit.

This flowchart describes the operation of the present technology wherein the glass junction box layer 10120 further comprises a junction box that accepts an input from a secondary source comprising one or more from the group of a photovoltaic system, solar module, photovoltaic glass, wherein the junction block 10120 combines the energy coming from the secondary source with the energy collected by the glass perovskite photovoltaic system 10100.

FIG. 15 is a flowchart that describes the operation of the system of the present technology.

STEP 15601 Glass perovskite photovoltaic system 10100 (PPS) receives the sun rays.

STEP 15602 Determine if the photons received are in the high band gap, or high energy photons?

STEP 15603 Glass perovskite photovoltaic system 10100 convert the photons received under the perovskite band gap to electrons, then step 15606.

STEP 15604 The photons that are outside the perovskite band gap pass through the glass perovskite photovoltaic system 10100 to the solar module 49000.

STEP 15605 The solar module 49000 converts the photons to electrons, then step 15606.

STEP 15606 The electrons are then distributed or stored.

FIG. 16 is a side cross sectional view of an alternative embodiment of the enhanced solar collector 49001 that includes a light concentrator (16700). The light concentrator 16700 is retained by the frame 49117 and covers the glass perovskite photovoltaic system 10100. The light concentrator 16700 is made of a translucent or transparent material including but not limited to glass or a translucent or transparent polymer. It is curved to provide a convex surface.

FIG. 17 is a side cross sectional view of an alternative embodiment of the enhanced solar collector 49001. The translucent photovoltaic stack 10101 is curved to provide a convex surface and acts as a light concentrator, which amplifies the low band gap photons that pass through to the solar module 49000.

FIG. 18 is a flowchart describing the method to determine the characteristics of the glass perovskite photovoltaic system 10100.

STEP 16801 Determining the utilisable band gap of a deployed solar module 49000.

STEP 16802 Comparing the results of the determination with a data table; wherein the data table includes data pertaining to optimization of high and low band gaps.

STEP 16803 Making a determination of the tunable band gap of the semiconductor layer 10110 compatible with the deployed solar module 49000.

STEP 16805 Making a based on the tunable band gap determination.

In an alternative embodiment of the technology, the enhanced solar collector 49001 is optimised to manage the differentials for the load. For example, in a multiple module configuration, such as the ones in solar farms or rooftops, if the solar module 49000 has reached its end of life at for example 80% of the 200 watts (W) of normal operation (160 W) and the glass perovskite photovoltaic system 10100 produces 100 W, the wattage needs to be adjusted to no more than 200 W. The glass junction box layer 10120 manages the wattage.

While example embodiments have been described in connection with what is presently considered to be an example of a possible most practical and/or suitable embodiment, it is to be understood that the descriptions are not to be limited to the disclosed embodiments, but on the contrary, is intended to cover various modifications and equivalent arrangements included within the spirit and scope of the example embodiment. Those skilled in the art will recognize or be able to ascertain using no more than routine experimentation, many equivalents to the specific example embodiments specifically described herein. Such equivalents are intended to be encompassed in the scope of the claims, if appended hereto or subsequently filed.

The invention claimed is:

1. A perovskite photovoltaic film system for use with a near end-of-life or end-of-life silicon solar panel, the photovoltaic film system comprising:
   a translucent photovoltaic film stack which includes, in order,
      an outer protective layer,
      an outer translucent electrode layer,
      one of an electron transport layer or a hole transport layer,
      a semi-conductor perovskite layer,
      the other of the hole transport layer or the electron transport layer and
      an inner translucent electrode layer,
   an inverter;
   and electrical connectors connecting the inverter to each of the outer translucent electrode layer and the inner translucent electrode layer, wherein the translucent photovoltaic film stack defines a protective convex cover that is configured to be spaced apart from the near end-of-life or end-of-life silicon solar panel.

2. The perovskite photovoltaic film system of claim 1, further consisting of a frame which encases the photovoltaic film stack.

3. The perovskite photovoltaic film system of claim 1 further comprising a junction box which is located centrally on the outer protection layer and is retained by the outer protective layer.

4. The perovskite photovoltaic film system of claim 1, further comprising a second perovskite photovoltaic film system, which is is tuned to convert energy from a different band gap as the perovskite photovoltaic film system.

* * * * *